United States Patent
Itagaki et al.

(10) Patent No.: US 8,189,391 B2
(45) Date of Patent: May 29, 2012

(54) NON-VOLATILE SEMICONDUCTOR STORAGE DEVICE INCLUDING A CONTROL CIRCUIT

(75) Inventors: Kiyotaro Itagaki, Yokohama (JP); Yoshihisa Iwata, Yokohama (JP); Hiroyasu Tanaka, Tokyo (JP); Masaru Kidoh, Tokyo (JP); Masaru Kito, Yokohama (JP); Ryota Katsumata, Yokohama (JP); Hideaki Aochi, Kawasaki (JP); Akihiro Nitayama, Yokohama (JP); Takashi Maeda, Yokohama (JP); Tomoo Hishida, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 239 days.

(21) Appl. No.: 12/620,986

(22) Filed: Nov. 18, 2009

(65) Prior Publication Data

US 2010/0172189 A1    Jul. 8, 2010

(30) Foreign Application Priority Data

Jan. 8, 2009    (JP) ................................ 2009-002376

(51) Int. Cl.
*G11C 16/04*    (2006.01)
(52) U.S. Cl. ........... 365/185.17; 365/185.18; 365/185.2; 365/185.29
(58) Field of Classification Search ............. 365/185.17, 365/185.18, 185.2, 185.29
See application file for complete search history.

(56) References Cited

U.S. PATENT DOCUMENTS

2007/0252201 A1*  11/2007  Kito et al. ................. 257/331
2010/0124116 A1*   5/2010  Maeda et al. ........... 365/185.11

FOREIGN PATENT DOCUMENTS

| KR | 10-2007-0096972 | 10/2007 |
| WO | WO 2009/075370 A1 | 6/2009 |
| WO | WO 2010/035609 A1 | 4/2010 |

OTHER PUBLICATIONS

Yoshiaki Fukuzumi, et al., "Optimal Integration and Characteristics of Vertical Array Devices for Ultra-High Density, Bit-Cost Scalable Flash Memory", Electron Devices Meeting, IEDM, IEEE International, Dec. 10-12, 2007, pp. 449-452.
U.S. Appl. No. 12/679,991, filed Mar. 25, 2010, Fukuzumi et al.
U.S. Appl. No. 12/886,874, filed Sep. 21, 2010, Iwata.
Office Action issued Mar. 14, 2011, in Korea Patent Application No. 10-2010-1700 (with English translation).
U.S. Appl. No. 12/846,234, filed Jul. 29, 2010, Itagaki, et al.
U.S. Appl. No. 13/235,389, filed Sep. 18, 2011, Itagaki, et al.

* cited by examiner

*Primary Examiner* — Hoai V Ho
(74) *Attorney, Agent, or Firm* — Oblon, Spivak, McClelland, Maier & Neustadt, L.L.P.

(57) ABSTRACT

A non-volatile semiconductor storage device includes: a memory string including a plurality of memory cells connected in series; a first selection transistor having one end connected to one end of the memory string; a first wiring having one end connected to the other end of the first selection transistor; a second wiring connected to a gate of the first selection transistor. A control circuit is configured to boost voltages of the second wiring and the first wiring in the erase operation, while keeping the voltage of the first wiring greater than the voltage of the second wiring by a certain potential difference. The certain potential difference is a potential difference that causes a GIDL current.

18 Claims, 31 Drawing Sheets

NON-VOLATILE SEMICONDUCTOR STORAGE DEVICE INCLUDING A CONTROL CIRCUIT

CROSS-REFERENCE TO RELATED APPLICATIONS

This application is based upon and claims the benefit of priority from the prior Japanese Patent Application No. 2009-2376, filed on Jan. 8, 2009, the entire contents of which are incorporated herein by reference.

BACKGROUND OF THE INVENTION

1. Field of the Invention

The present invention relates to an electrically rewritable non-volatile semiconductor storage device.

2. Description of the Related Art

As refinement technologies are pushed to the limit for improving the bit density of non-volatile semiconductor storage devices such as NAND type flash memory, there is increasing demand for lamination of memory cells. As one example, there have been proposed such non-volatile semiconductor storage devices where memory cells are configured with vertical transistors (see, for example, Japanese Patent Laid-Open No. 2007-266143). Lamination-type non-volatile semiconductor storage devices have columnar semiconductor layers, MONOS layers formed to surround the columnar semiconductor layers, and conductive layers formed to surround the MONOS layers.

For planar-type non-volatile semiconductor storage devices, the erase operation is performed by increasing the substrate potential corresponding to a channel to an erase voltage so that electrons are removed from relevant MONOS layers. However, the above-mentioned lamination-type non-volatile semiconductor storage devices should involve columnar semiconductor layers as their channels. Thus, it is inefficient and infeasible to perform the erase operation in the lamination-type non-volatile semiconductor storage devices in the same manner as in the planar-type devices.

Therefore, it is desirable to provide such lamination-type non-volatile semiconductor storage devices in which the erase operation can be performed in an efficient manner.

SUMMARY OF THE INVENTION

One aspect of the present invention provides a non-volatile semiconductor storage device comprising: a memory string including a plurality of memory cells connected in series; a first selection transistor having one end connected to one end of the memory string; a first wiring having one end connected to the other end of the first selection transistor; a second wiring connected to a gate of the first selection transistor; and a control circuit configured to perform erase operation to erase data from the memory cells, the memory string comprising: a first semiconductor layer having a columnar portion extending in a vertical direction to a substrate; an electric charge storage layer formed to surround the first semiconductor layer; and a first conductive layer surrounding the electric charge storage layer and extending parallel to the substrate, the first selection transistor comprising: a second semiconductor layer in contact with a top or bottom surface of the columnar portion and extending in the vertical direction to the substrate; a first gate insulation layer formed to surround the second semiconductor layer; and a second conductive layer surrounding the first gate insulation layer and extending parallel to the substrate, the control circuit being configured to boost voltages of the second wiring and the first wiring in the erase operation, while keeping the voltage of the first wiring greater than the voltage of the second wiring by a certain potential difference, the certain potential difference being a potential difference that causes a gate induced drain leakage (GIDL) current.

DETAILED DESCRIPTION OF THE EMBODIMENTS

Embodiments of a non-volatile semiconductor storage device according to the present invention will now be described below with reference to the accompanying drawings.

First Embodiment

Figure 1:
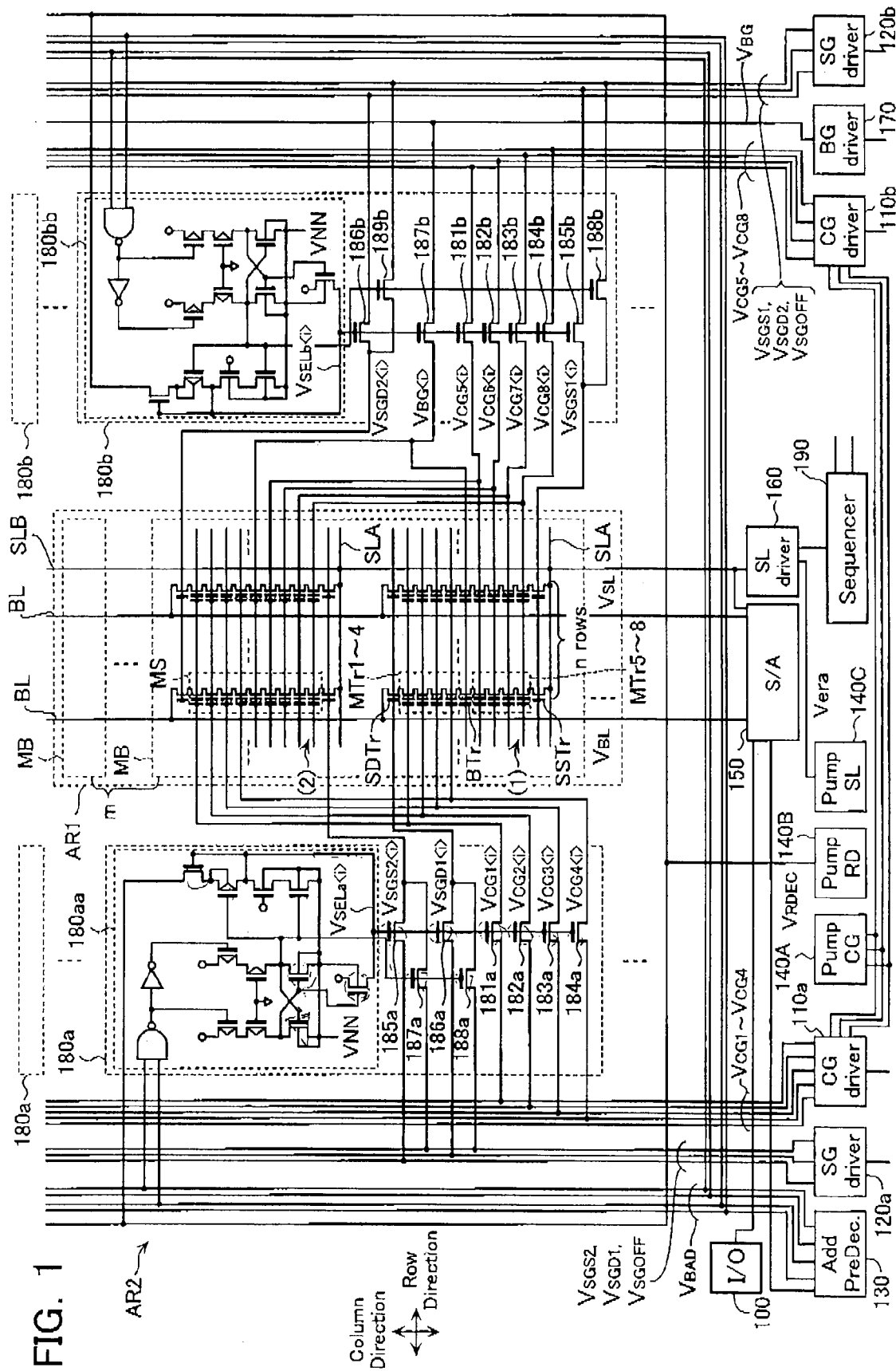
FIG. 1 is a circuit diagram of a non-volatile semiconductor storage device according to a first embodiment of the present invention.

General Configuration of Non-Volatile Semiconductor Storage Device in First Embodiment Referring first to FIG. 1, a general configuration of a non-volatile semiconductor storage device according to a first embodiment will be described below. FIG. 1 is a circuit diagram of the non-volatile semiconductor storage device in the first embodiment.

As illustrated in FIG. 1, the non-volatile semiconductor storage device in the first embodiment comprises a memory cell array AR1 and a control circuit AR2 provided on the periphery thereof. The memory cell array AR1 has electrically rewritable memory transistors MTr1 to MTr8 (memory cells). The control circuit AR2 includes control circuits for controlling voltage applied to the memory transistors MTr1 to MTr8 and so on.

As illustrated in FIG. 1, the memory cell array AR1 has m columns of memory blocks MB. Each memory block MB comprises n rows and 2 columns of memory strings MS, source-side selection transistors SSTr each connected to one end of the memory string MS, and drain-side selection transistors SDTr each connected to the other end of the memory string MS. Note that in the example of FIG. 1, the first column is denoted by (1) and the second column by (2).

Figure 2:
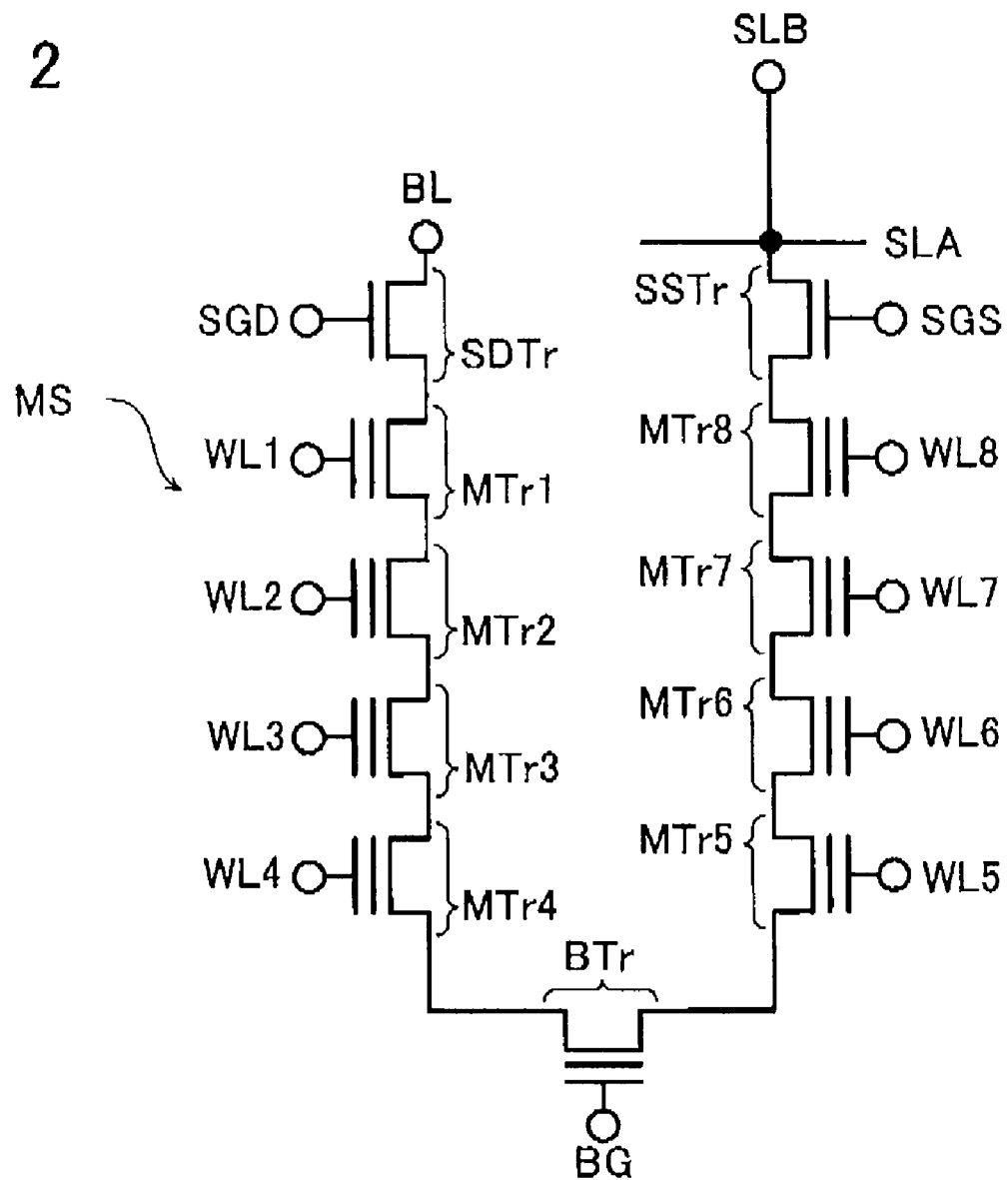
FIG. 2 is a circuit diagram of one memory string MS according to the first embodiment.

As illustrated in FIG. 2, each memory string MS has memory transistors MTr1 to MTr8 and a back-gate transistor BTr. The memory transistors MTr1 to MT4 are connected in series. The memory transistors MTr5 to MTr8 are connected in series. The back-gate transistor BTr is provided between the memory transistors MTr4 and MTr5. The memory transistors MTr1 to MTr8, which include a MONOS structure, cause electric charges to be accumulated in respective control gates. Through the accumulation of electric charges, the non-volatile semiconductor storage device in the first embodiment store data.

As illustrated in FIG. 2, the control gates of the memory transistors MTr1 to MTr8 are connected to the word lines WL1 to WL8. The control gate of the back-gate transistor BTr is connected to the back-gate line BG.

As illustrated in FIG. 1, respective word lines WLi (i=1 to 8) are provided in common to the control gates of respective memory transistors MTri (i=1 to 8) in those memory strings MS aligned in the row direction, and formed to extend in the row direction across the memory strings MS. Similarly, each back-gate line BG is provided in common to the control gates of the back-gate transistors BTr aligned in the row direction, and formed to extend in the row direction across the memory strings MS.

As illustrated in FIG. 2, one end of each source-side selection transistor SSTr is connected to one end of a memory transistor MTr8. The other end of each source-side selection transistor SSTr is connected to a first source line SLA. The control gate of each source-side selection transistor SSTr is connected to a source-side selection gate line SGS.

As illustrated in FIG. 1, each first source line SLA is provided in common to the sources of the source-side selection transistors SSTr aligned in the row direction, and formed to extend in the row direction across a plurality of memory strings MS. The first source lines SLA aligned in the column direction are commonly connected to single second source line SLB extending in the column direction. Each source-side selection gate line SGS is provided in common to the control gates of the source-side selection transistors SSTr aligned in the row direction, and formed to extend in the row direction across a plurality of memory strings MS.

As illustrated in FIG. 2, one end of each drain-side selection transistor SDTr is connected to one end of a memory transistor MTr1. The other end of each drain-side selection transistor SDTr is connected to a bit line BL. The control gate of each drain-side selection transistor SDTr is connected to a drain-side selection gate line SGD.

As illustrated in FIG. 1, each bit line BL is provided in common to the drains of the drain-side selection transistors SDTr aligned in the column direction, and formed to extend in the column direction across a plurality of memory blocks MB. Each drain-side selection gate line SGD is provided in common to the control gates of the drain-side selection transistors SDTr aligned in the row direction, and formed to extend in the row direction across a plurality of memory strings MS.

In erase operation, the control circuit AR2 boosts the voltage of a source line SL and a source-side selection gate line SGS, while keeping the voltage of the source line SL (first and second source lines SLA and SLB) greater than that of the source-side selection gate line SGS by a certain potential difference. The certain potential difference is a potential difference Vth that causes a GIDL current. This is one of the characteristics of this embodiment. Note that the certain potential difference is not limited to the potential difference Vth.

As illustrated in FIG. 1, the control circuit AR2 has an input/output circuit 100, word-line driving circuits 110a and 110b, the selection-gate-line driving circuits 120a and 120b, an address decoder circuit 130, boost circuits 140A to 140C, a sense amplifier circuit 150, a source-line driving circuit 160, aback-gate-line driving circuit 170, a first row decoder circuit 180a, a second row decoder circuit 180b, and a sequencer 190.

As illustrated in FIG. 1, the input/output circuit 100 receives information to be input to the memory cell array AR1 from the outside and inputs it to the sense amplifier circuit 150. In addition, the input/output circuit 100 outputs the information from the sense amplifier circuit 150.

As illustrated in FIG. 1, the word-line driving circuit 110a outputs signals $V_{CG1}$ to $V_{CG4}$ for driving word lines WL1 to WL4. The word-line driving circuit 110b outputs signals $V_{CG5}$ to $V_{CG8}$ for driving word lines WL5 to WL8.

The selection-gate-line driving circuit 120a outputs signals $V_{SGS1}$, $V_{SGD2}$, and $V_{SGOFF}$. The selection-gate-line driving circuit 120a outputs signals $V_{SGS2}$, $V_{SGD1}$, and $V_{SGOFF}$. The signals $V_{SGS1}$ and $V_{SGS2}$ are used in driving a source-side selection gate line SGS in a memory block that is selected (which is hereinafter referred to as a "selected memory block MB"). The signals $V_{SGD2}$ and $V_{SGD1}$ are used in driving a drain-side selection gate line SGD in a selected memory block MB. The signal $V_{SGOFF}$ is used in driving source-side selection gate lines SGS and drain-side selection gate lines SGD in memory blocks MB that are not selected (which is hereinafter referred to as "unselected memory blocks MB").

The address decoder circuit 130 outputs a signal $V_{BAD}$ for specifying a block address.

The boost circuit 140A boosts the voltage from a power supply voltage, and transfers the boosted voltage to the word-line driving circuits 110a and 110b. The boost circuit 140B boosts the voltage from a power supply voltage to obtain a signal $V_{RDEC}$, which is output to the first and second row decoder circuits 180a and 180b. The boost circuit 140C boosts the voltage from a power supply voltage to obtain a signal $V_{ERA}$, which is output to the source-line driving circuit 160. The signal $V_{ERA}$ is used in erasing data from memory transistors MTr1 to MTr8.

The sense amplifier circuit 150 reads information based on the voltage of a bit line BL. In addition, the sense amplifier circuit 150 provides a bit line BL with a signal at the same voltage as that of a signal $V_{SL}$ of the source line SL (first and second source lines SLA and SLB). Furthermore, the sense amplifier circuit 150 receives a signal $V_{BAD}$ input from the address decoder circuit 130.

The source-line driving circuit 160 outputs a signal $V_{SL}$ for driving a source line SL (first and second source lines SLA and SLB). The back-gate-line driving circuit 170 outputs a signal $V_{BG}$ for driving a back-gate line BG.

The first and second row decoder circuits 180a and 180b are provided, one for each memory block MB, respectively. Each first row decoder circuit 180a is provided at one end in the row direction of a respective memory block MB. Each second row decoder circuit 180b is provided at the other end in the row direction of a respective memory block MB.

Each first row decoder circuit 180a selectively inputs signals $V_{CG1<i>}$ to $V_{CG4<i>}$ to the gates of memory transistors MTr1 to MTr4, based on the signal $V_{BAD}$ output from the address decoder circuit 130. In addition, based on the signal $V_{BAD}$, the first row decoder circuit 180a selectively inputs a signal $V_{SGS2<i>}$ to the gates of the source-side selection transistors SSTr in the second column. Furthermore, based on the signal $V_{BAD}$, the first row decoder circuit 180a selectively inputs a signal $V_{SGD1<i>}$ to the gates of the drain-side selection transistors SDTr in the first column.

Each first row decoder circuit 180a has a voltage conversion circuit 180aa, first transfer transistors 181a to 186a, and second transfer transistors 187a and 188a. The voltage conversion circuit 180aa generates a signal $V_{SELa<i>}$ based on the received signals $V_{BAD}$ and $V_{RDEC}$, which in turn is output to the gates of the first transfer transistors 181a to 186a. In addition, the voltage conversion circuit 180aa controls the gates of the second transfer transistors 187a and 188a based on the voltage of the received signal $V_{BAD}$.

The gates of the first transfer transistors 181a to 184a receive the signal $V_{SELa<i>}$ from the voltage conversion circuit 180aa. The first transfer transistors 181a to 184a are connected between the word-line driving circuit 110a and the word lines WL1 to WL4. The first transfer transistors 181a to 184a output signals $V_{CG1<i>}$ to $V_{CG4<i>}$ to the word lines WL1 to WL4 based on the signals $V_{CG1}$ to $V_{CG4}$ and $V_{SELa<i>}$. In addition, the first transfer transistor 185a is connected between the selection-gate-line driving circuit 120a and the source-side selection gate line SGS of the source-side selection transistors SSTr in the second column. The first transfer transistor 185a outputs a signal $V_{SGS2<i>}$ to the source-side selection gate line SGS based on the signals $V_{SGS2}$ and $V_{SELa<i>}$. In addition, the first transfer transistor 186a is connected between the selection-gate-line driving circuit 120a and the drain-side selection gate lines SGD of the drain-side selection transistors SDTr in the first column. The first transfer transistor 186a outputs a signal $V_{SGD1<i>}$ to the drain-side selection gate lines SGD based on the signals $V_{SGD1}$ and $V_{SELa<i>}$.

The gates of the second transfer transistors 187a and 188a receive a signal from the voltage conversion circuit 180aa. The second transfer transistor 187a has one end that is connected to the source-side selection gate line SGS of the source-side selection transistors SSTr in the second column, and the other end to which a signal $V_{SGOFF}$ is input. The second transfer transistor 188a has one end that is connected to the drain-side selection gate line SGD of the drain-side selection transistors SDTr in the first column, and the other end to which a signal $V_{SGOFF}$ is input.

Each second row decoder circuit 180b selectively inputs signals $V_{CG5<i>}$ to $V_{CGB<i>}$ to the gates of memory transistors MTr5 to MTr8, based on the signal $V_{BAD}$ output from the address decoder circuit 130. In addition, based on the signal $V_{BAD}$, the second row decoder circuit 180b selectively inputs a signal $V_{SGS1<i>}$ to the gates of the source-side selection transistors SSTr in the first column. In addition, based on the signal $V_{BAD}$, the second row decoder circuit 180b selectively inputs a signal $V_{SGD2<i>}$ to the gates of the drain-side selection transistors SDTr in the second column. Furthermore, based on the signal $V_{BAD}$, the second row decoder circuit 180b selectively inputs a signal $V_{BG<i>}$ to the gates of the back-gate transistors BTr.

Each second row decoder circuit 180b has a voltage conversion circuit 180bb, first transfer transistors 181b to 187b, and second transfer transistors 188b and 189b. The voltage conversion circuit 180bb generates a signal $V_{SELb<i>}$ based on the voltages of the received signals $V_{BAD}$ and $V_{RDEC}$, and outputs it to the gates of the first transfer transistors 181b to 187b. In addition, the voltage conversion circuit 180bb controls the gates of the second transfer transistors 188b and 189b based on the received signal $V_{BAD}$.

The gates of the first transfer transistors 181b to 187b receive the signal $V_{SELb<i>}$ from a voltage conversion circuit 180bb. The first transfer transistors 181b to 184b are connected between the word-line driving circuit 110b and the word lines WL5 to WL8, respectively. The first transfer transistors 181b to 184b input signals $V_{CG5<1>}$ to $V_{CG8<i>}$ to the word lines WL5 to WL8 based on the signals $V_{CG5}$ to $V_{CG8}$ and $V_{SELb<i>}$. In addition, the first transfer transistor 185b is connected between the selection-gate-line driving circuit 120b and the source-side selection gate lines SGS of the source-side selection transistors SSTr in the first column. The first transfer transistor 185b outputs a signal $V_{SGS1<i>}$ to the source-side selection gate lines SGS based on the signals $V_{SGS1}$ and $V_{SELb<i>}$. In addition, the first transfer transistor 186b is connected between the selection-gate-line driving circuit 120b and the drain-side selection gate lines SGD of the drain-side selection transistors SDTr in the second column.

The first transfer transistor 186$b$ outputs a signal $V_{SGD2<i>}$ to the drain-side selection gate lines SGD based on the signals $V_{SGD2}$ and $V_{SELb<i>}$. In addition, the first transfer transistor 187$b$ is connected between the back-gate-line driving circuit 170 and the back-gate lines BG. The first transfer transistor 187$b$ inputs a signal $V_{BG<i>}$ to the back-gate lines BG based on the signals $V_{BG}$ and $V_{SELb<i>}$.

The gates of the second transfer transistors 188$b$ and 189$b$ receive signals from the voltage conversion circuit 180$bb$. The second transfer transistor 188$b$ has one end that is connected to the source-side selection gate lines SGS of the source-side selection transistors SSTr in the first column, and the other end to which a signal $V_{SGOFF}$ is input. The second transfer transistor 189$b$ has one end that is connected to the drain-side selection gate lines SGD of the drain-side selection transistors SDTr in the second column, and the other end to which a signal $V_{SGOFF}$ is input.

The sequencer 190 inputs control signals to the word-line driving circuits 110$a$ and 110$b$, the selection-gate-line driving circuits 120$a$ and 120$b$, and the source-line driving circuit 160.

Figure 3:
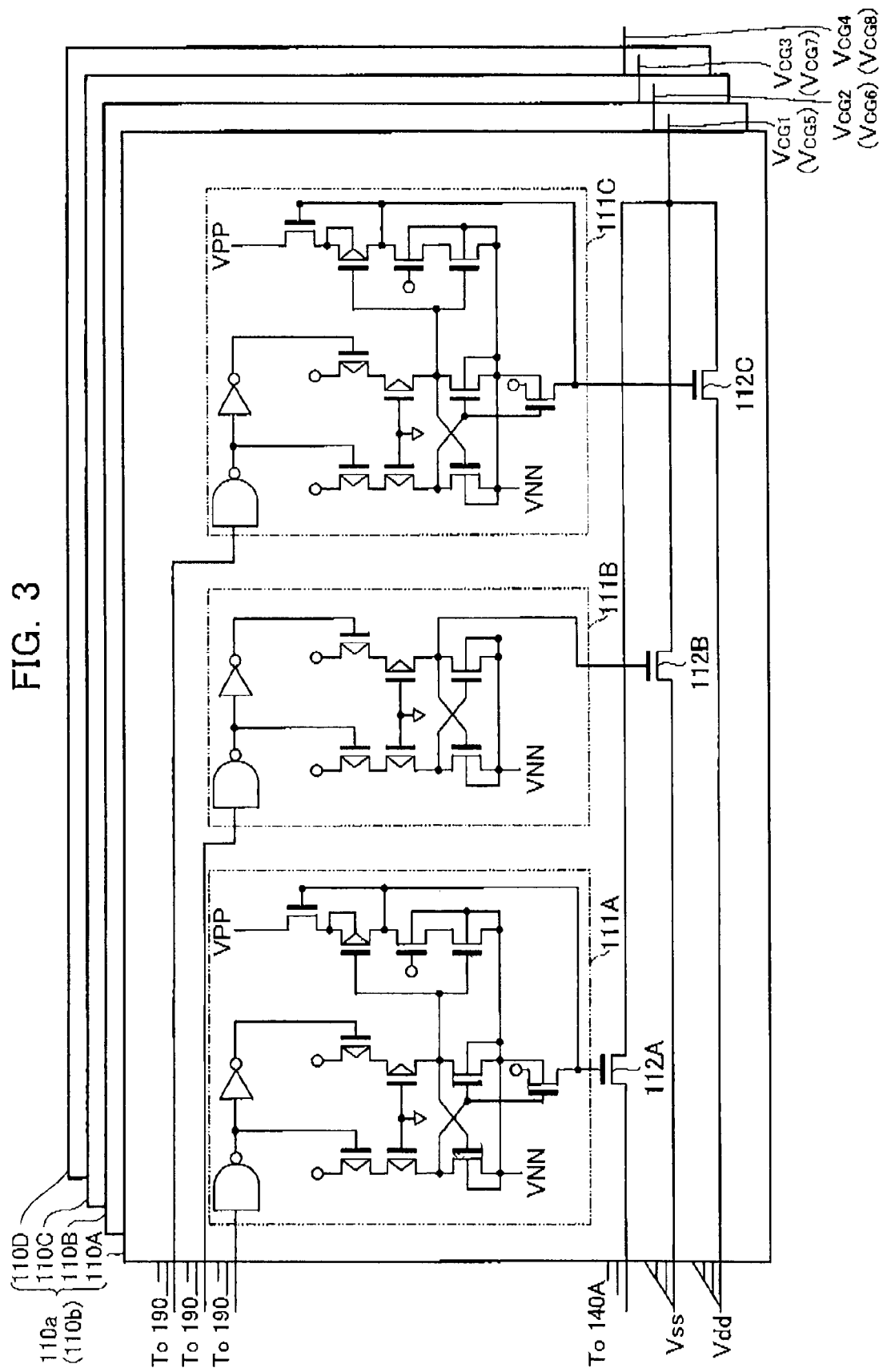
FIG. 3 is a circuit diagram of a word-line driving circuit 110a (110b) according to the first embodiment.

As illustrated in FIG. 3, each word-line driving circuit 110$a$ includes first to fourth word-line driving circuits 110A to 110D. The first word-line driving circuit 110A outputs a signal $V_{CG1}$. The second word-line driving circuit 110B outputs a signal $V_{CG2}$. The third word-line driving circuit 110C outputs a signal $V_{CG3}$. The fourth word-line driving circuit 110D outputs a signal $V_{CG4}$.

As illustrated in FIG. 3, each word-line driving circuit 110$b$ includes first to fourth word-line driving circuits 110A to 110D. The first word-line driving circuit 110A outputs a signal $V_{CG5}$. The second word-line driving circuit 110B outputs a signal $V_{CG6}$. The third word-line driving circuit 110C outputs a signal $V_{CG7}$. The fourth word-line driving circuit 110D outputs a signal $V_{CG8}$.

As illustrated in FIG. 3, each first word-line driving circuit 110A has voltage conversion circuits 111A to 111C and transfer transistors 112A to 112C. The voltage conversion circuits 111A to 111C have input terminals that receive control signals input from the sequencer 190. The voltage conversion circuits 111A to 111C have output terminals connected to the gates of the transfer transistors 112A to 112C. The output terminals of the transfer transistors 112A to 1120 are commonly connected. The input terminal of the transfer transistor 112A is connected to the output terminal of the boost circuit 140A. The input terminal of the transfer transistor 112B is connected to the ground voltage Vss. The input terminal of the transfer transistor 112C is connected to the power supply voltage Vdd. Note that the second to fourth word-line driving circuits 110B to 110D have the same configuration as the first word-line driving circuit 110A.

Figure 4:
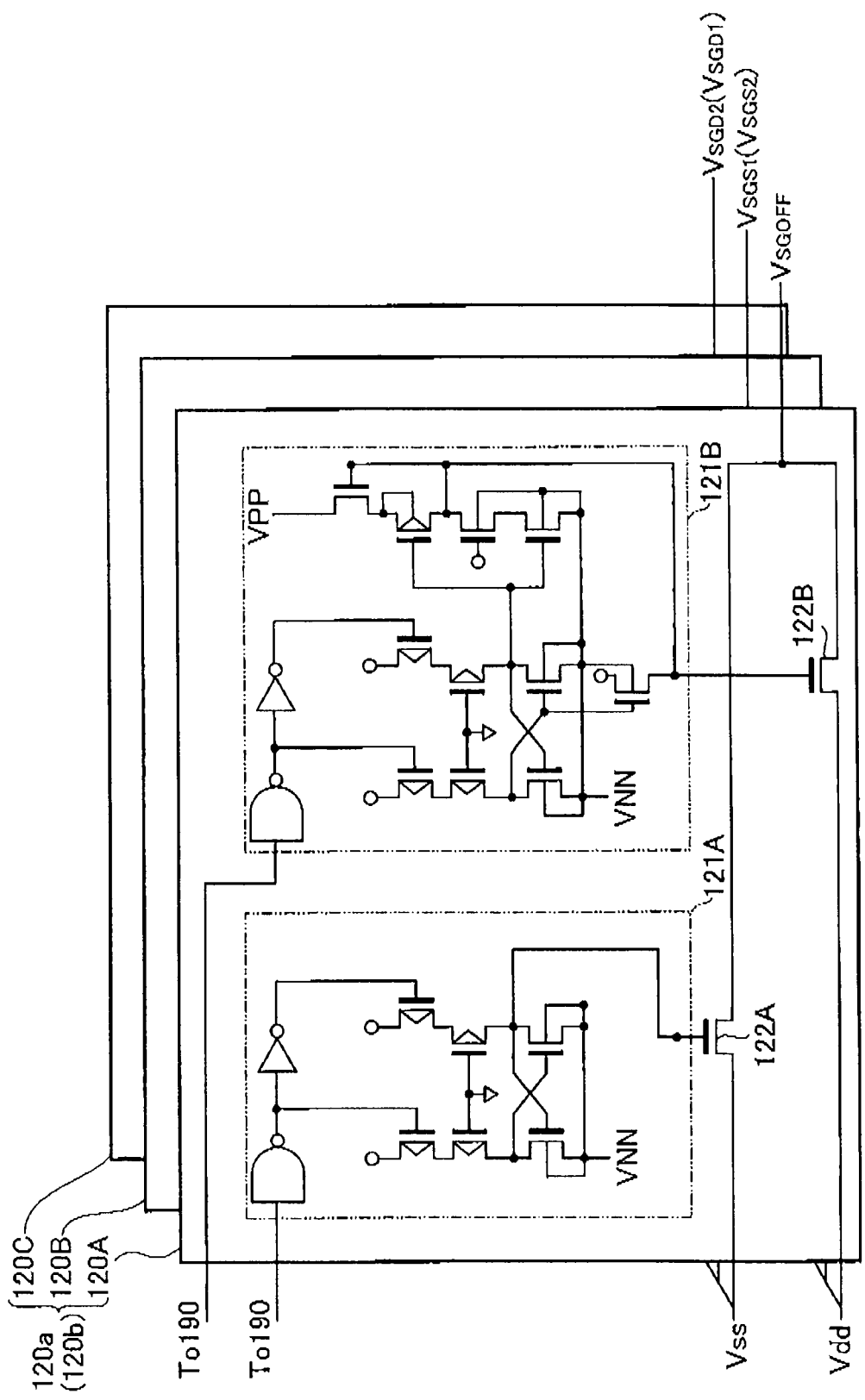
FIG. 4 is a circuit diagram of a selection-gate-line driving circuit 120a (120b) according to the first embodiment.

As illustrated in FIG. 4, each selection-gate-line driving circuit 120$a$ (120$b$) includes first to third selection-gate-line driving circuits 120A to 120C. The first selection-gate-line driving circuit 120A outputs a signal $V_{SGOFF}$. The second selection-gate-line driving circuit 120B outputs a signal $V_{SGS1}$ ($V_{SGS2}$). The third selection-gate-line driving circuit 120C outputs a signal $V_{SGD2}$ ($V_{SGD1}$).

As illustrated in FIG. 4, the first selection-gate-line driving circuit 120A has voltage conversion circuits 121A and 1212 and transfer transistors 122A and 122B. The voltage conversion circuits 121A and 121B have input terminals that receive signals from the sequencer 190. The voltage conversion circuits 121A and 121B have output terminals connected to the gates of the transfer transistors 122A and 122B. The output terminals of the transfer transistors 122A and 122B are commonly connected. The input terminal of the transfer transistor 122A is connected to the ground voltage Vss. The input terminal of the transfer transistor 122B is connected to the power supply voltage Vdd. Note that the second and third selection-gate-line driving circuits 120B and 1200 have the same configuration as the first selection-gate-line driving circuit 120A.

Figure 5:
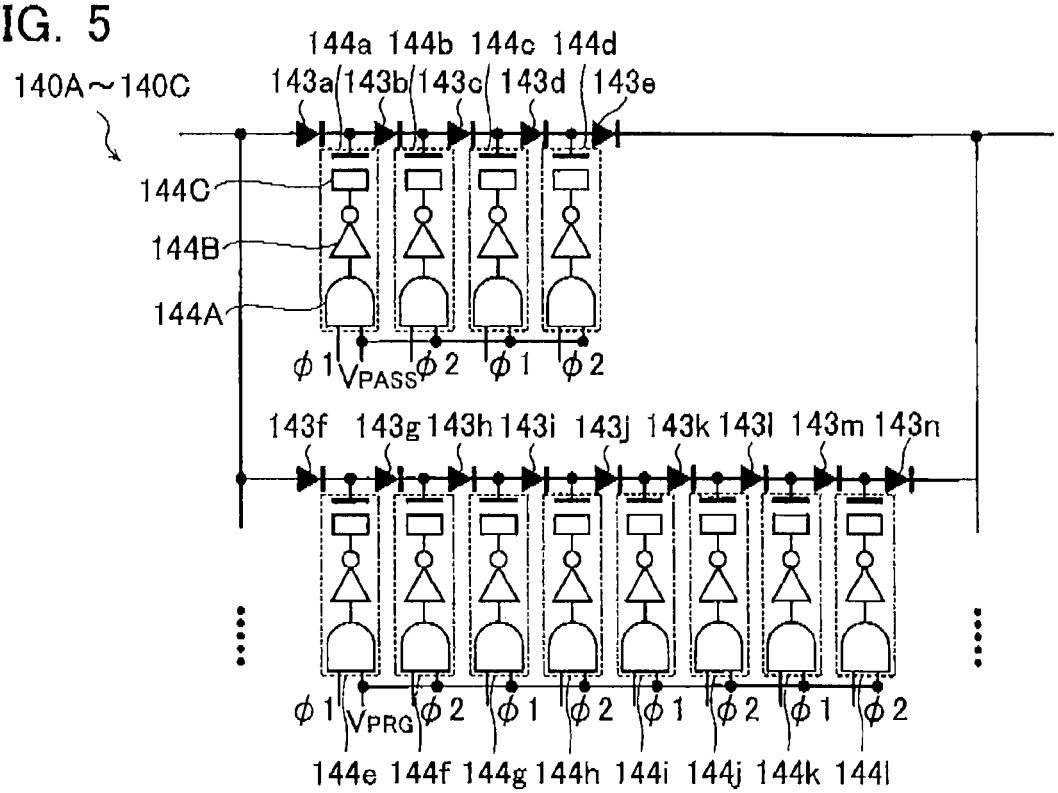
FIG. 5 is a circuit diagram of boost circuits 140A to 140C according to the first embodiment.

The boost circuits 140A to 140C generate voltages higher than the power supply voltage Vdd by means of charge and discharge of capacitors. As illustrated in FIG. 5, the boost circuits 140A to 140C have diodes 143$a$ to 143$n$ as well as charge and discharge circuits 144$a$ to 144$l$. Note that the boost circuits 140A to 140C may have more diodes and charge and discharge circuits.

As illustrated in FIG. 5, the diodes 143$a$ to 143$e$ are connected in series. The diodes 143$f$ to 143$n$ are connected in series. One end of the diode 143$a$ is connected to one end of the diode 143$f$. One end of the diode 143$e$ is connected to one end of the diode 143$n$.

As illustrated in FIG. 5, the charge and discharge circuits 144$a$ to 144$d$ have their output terminals connected between the diodes 143$a$ to 143$e$. The charge and discharge circuits 144$e$ to 144$l$ have their output terminals connected between the diodes 143$f$ to 143$n$. Each of the charge and discharge circuits 144$a$ to 144$l$ involves an AND circuit 144A, an inverter 144B, and a capacitor 144C connected in series.

In the charge and discharge circuits 144$a$ to 144$d$, the input terminals at one ends of the AND circuits 144A alternately receive signals φ1 or φ2. In the charge and discharge circuits 144$a$ to 144$d$, the input terminals at the other ends of the AND circuits 144A receive signals $V_{PASS}$.

In the charge and discharge circuits 144$e$ to 144$l$, the input terminals at one ends of the AND circuits 144A alternately receive signals φ1 or φ2. In the charge and discharge circuits 144$e$ to 144$l$, the input terminals at the other ends of the AND circuits 144A receive signals $V_{PRG}$.

Figure 6A:
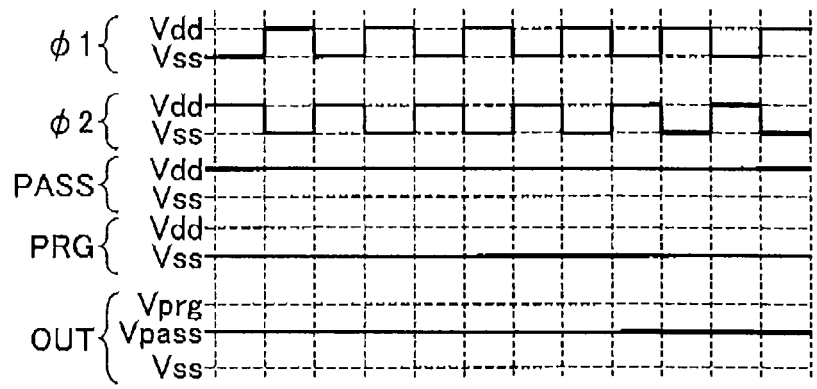
FIG. 6A is a timing chart illustrating operations of the boost circuits 140A to 140C.
Figure 6B:
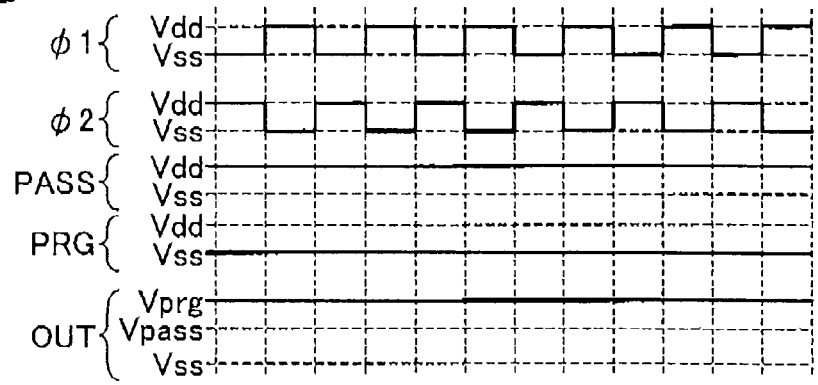
FIG. 6B is a timing chart illustrating operations of the boost circuits 140A to 140C.

Referring now to FIGS. 6A and 6B, operations of the boost circuits 140A to 140C will be described below. FIGS. 6A and 6B are timing charts illustrating operations of the boost circuits 140A to 140C. As illustrated in FIGS. 6A and 6B, the boost circuits 140A to 140C set signals $V_{PASS}$ or signals $V_{PRG}$ to the power supply voltage Vdd or the ground voltage Vss, depending on the generated signals.

Figure 7:
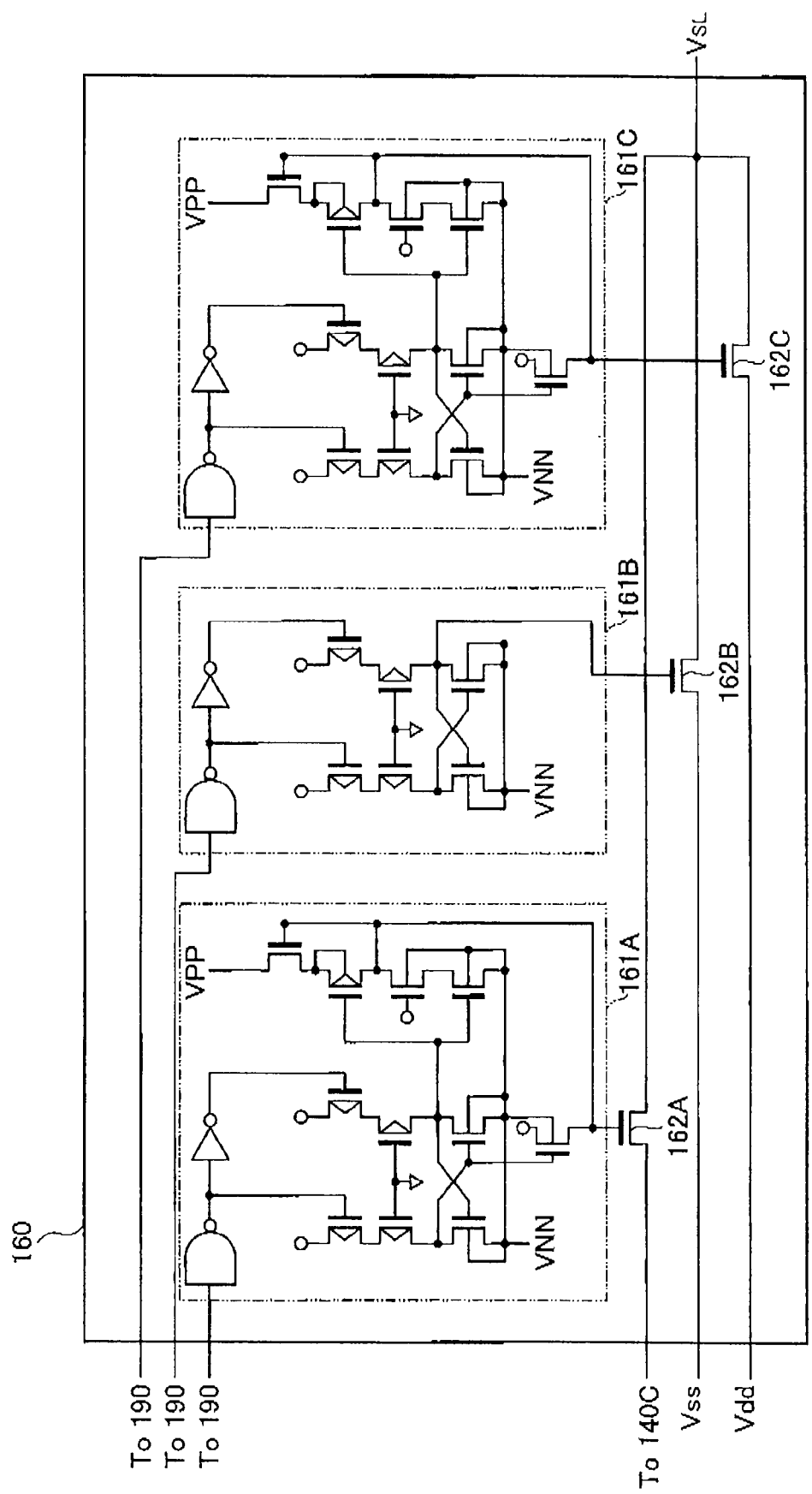
FIG. 7 is a circuit diagram of a source-line driving circuit 160 according to the first embodiment.

As illustrated in FIG. 7, the source-line driving circuit 160 has voltage conversion circuits 161A to 161C and transfer transistors 162A to 162C. The voltage conversion circuits 161A to 161C and the transfer transistors 162A to 162C are connected in the same manner as the voltage conversion circuits 111A to 111C and transfer transistors 112A to 112C in the word-line driving circuit 110$a$. The voltage conversion circuits 161A to 161C have input terminals that receive signals input from the sequencer 190. The input terminal of the transfer transistor 162A is connected to the output terminal of the boost circuit 140C. The input terminal of the transfer transistor 162B is connected to the ground voltage Vss. The input terminal of the transfer transistor 1620 is connected to the power supply voltage Vdd.

Figure 8:
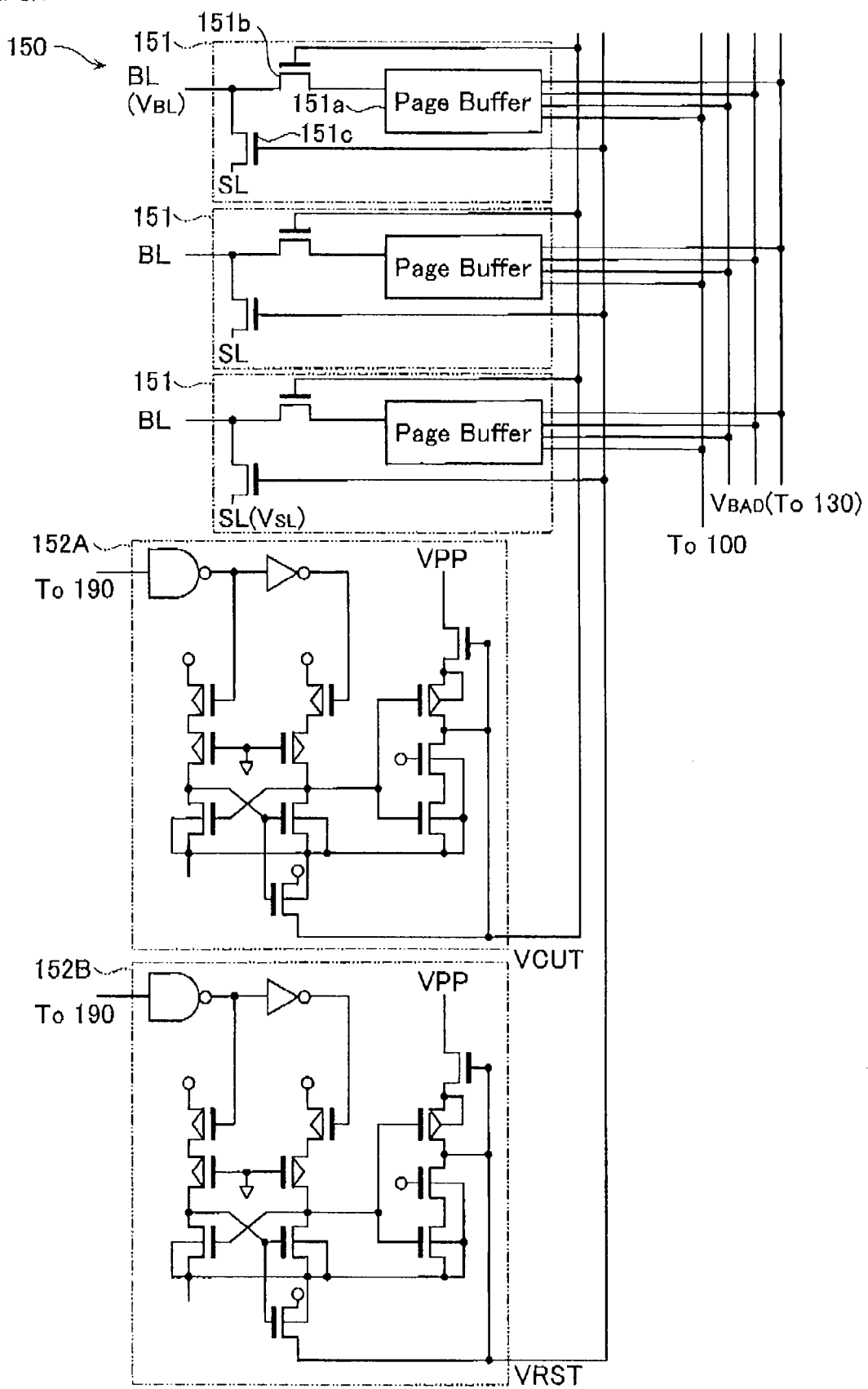
FIG. 8 is a circuit diagram of a sense amplifier circuit 150 according to the first embodiment.

As illustrated in FIG. 8, the sense amplifier circuit 150 has a plurality of selection circuits 151 and voltage conversion circuits 152A and 152B. Each selection circuit 151 selectively connects a bit line BL to a source lines SL, and sets the bit line BL to have the same potential as the source line SL.

As illustrated in FIG. 8, each selection circuit 151 has a page buffer 151$a$ and transistors 151$b$ and 151$c$. The page buffer 151$a$ has one end connected to one end of the transistor 151$b$ that receives a signal from a bit line BL, and inputs an output based on that signal to the input/output circuit 100 and the address decoder circuit 130. The transistor 151$b$ has the other end connected to the bit line BL. The transistor 151b also has a control gate that receives a signal VCUT output from the voltage conversion circuit 152A. The transistor 151c has one end connected to the bit line BL. The transistor 151c has the other end connected to a source line SL. The transistor 151c also has a control gate that receives a signal VRST output from the voltage conversion circuit 152B.

The voltage conversion circuit 152A receives a signal from the sequencer 190 and outputs a signal VCUT based on that signal. The voltage conversion circuit 152B receives a signal from the sequencer 190 and outputs a signal VEST based on that signal.

(Lamination Structure of Non-Volatile Semiconductor Storage Device in First Embodiment)

Figure 9:
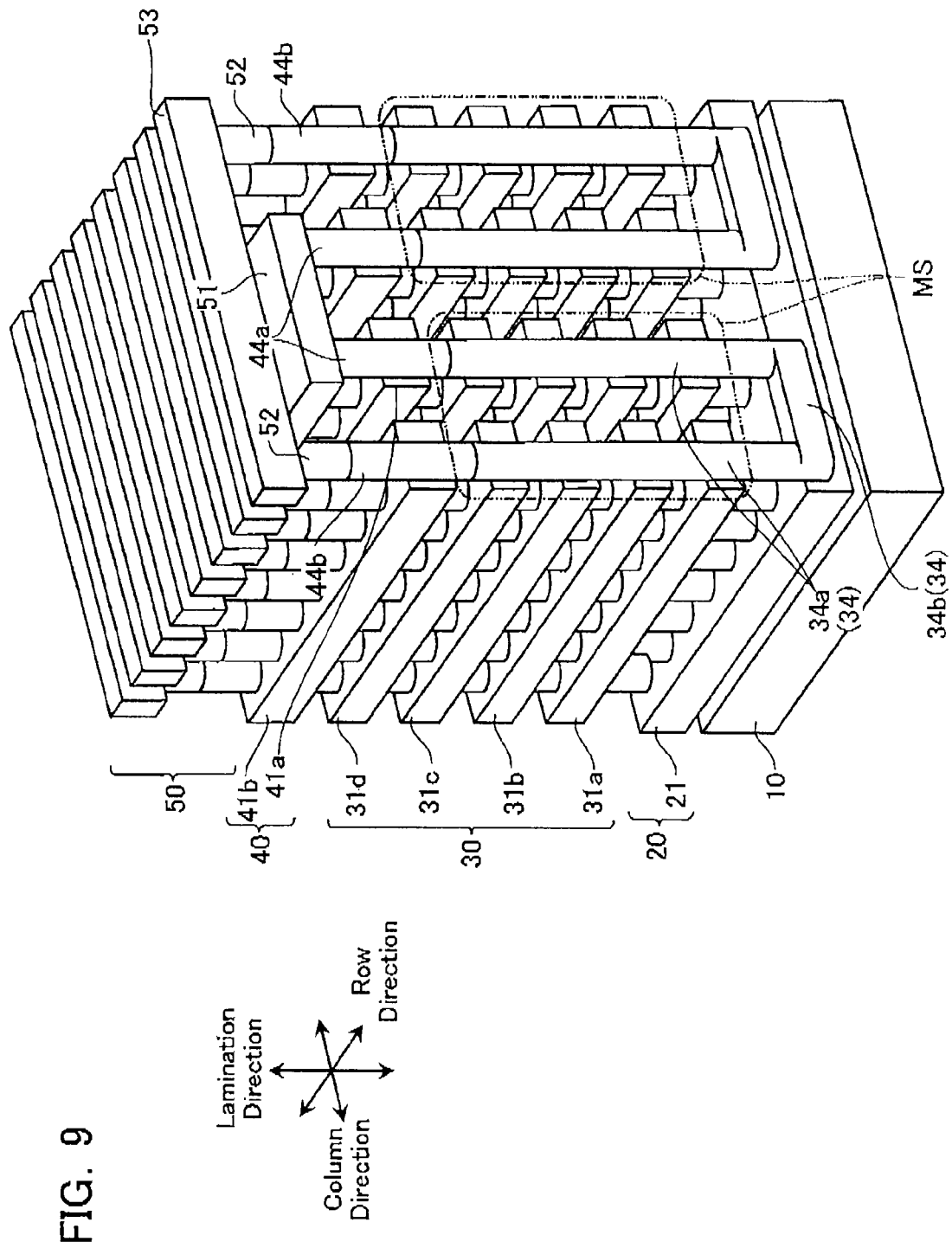
FIG. 9 is a schematic perspective view illustrating a part of a memory cell array AR1 in the non-volatile semiconductor storage device according to the first embodiment.
Figure 10:
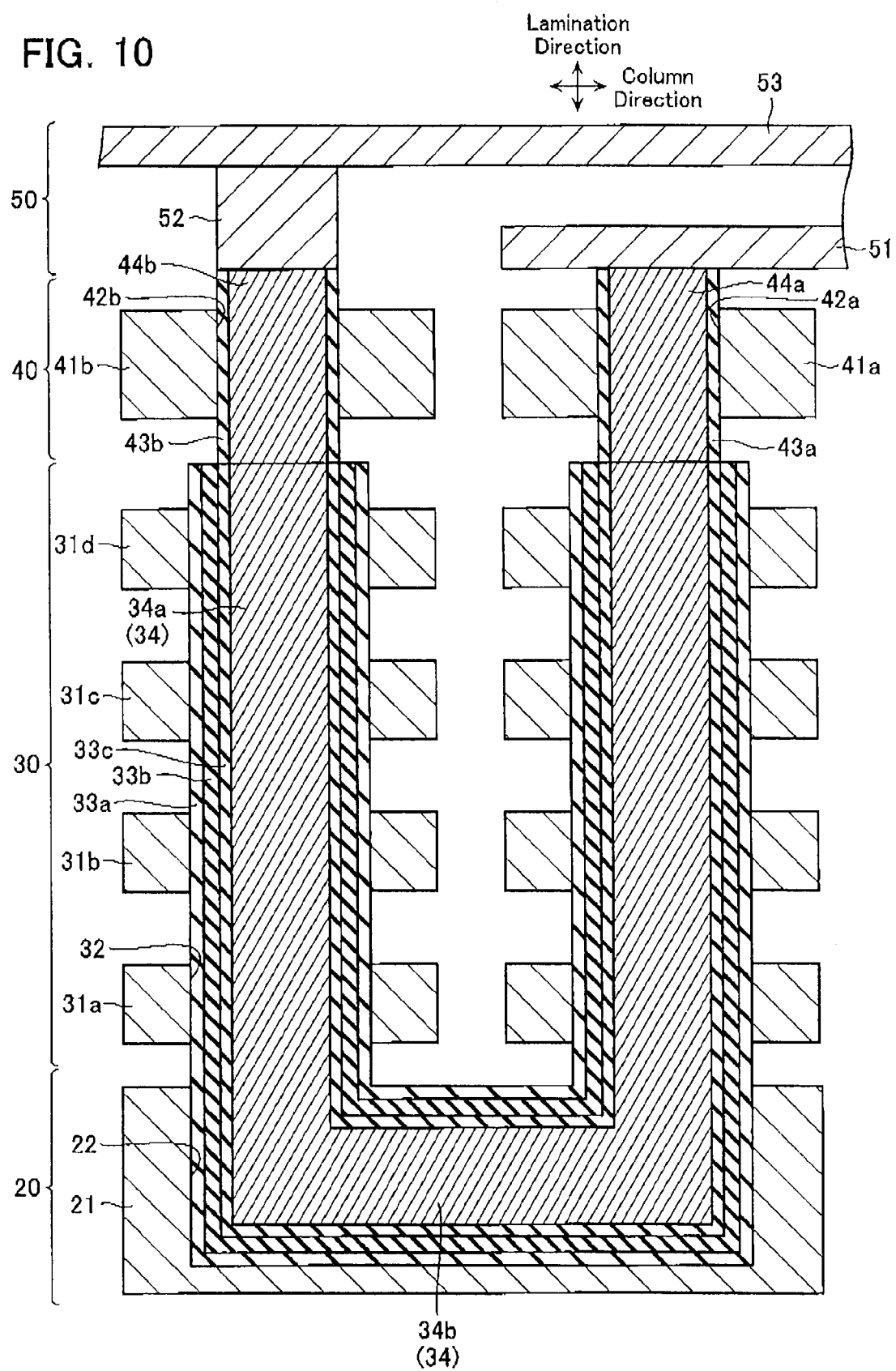
FIG. 10 is a partial cross-sectional view of FIG. 9.

Referring now to FIGS. 9 and 10, a lamination structure of the non-volatile semiconductor storage device according to the first embodiment will be described below. FIG. 9 is a schematic perspective view illustrating a part of a memory cell array AR1 in the non-volatile semiconductor storage device in the first embodiment. FIG. 10 is a partial cross-sectional view of FIG. 9.

As illustrated in FIG. 9, a memory cell array AR1 is provided on a substrate 10. The memory cell array AR1 has a back-gate transistor layer 20, a memory transistor layer 30, a selection transistor layer 40, and a wiring layer 50. The back-gate transistor layer 20 functions as back-gate transistors BTr. The memory transistor layer 30 functions as memory transistors MTr1 to MTr8 (memory strings MS). The selection transistor layer 40 functions as source-side selection transistors SSTr and drain-side selection transistors SDTr. The wiring layer functions as source lines SL and bit lines BL.

As illustrated in FIGS. 9 and 10, the back-gate transistor layer 20 has a back-gate conductive layer 21. The back-gate conductive layer 21 is formed to expand in a two dimensional manner in the row and column directions parallel to the substrate 10. The back-gate conductive layers 21 are separated for each memory block MB. The back-gate conductive layers 21 comprise polysilicon (p-Si). Each back-gate conductive layer 21 functions as a back-gate line BG.

As illustrated in FIG. 10, the back-gate transistor layer 20 has a back-gate hole 22. The back-gate hole 22 is formed to dig into the back-gate conductive layer 21. Each back-gate hole 22 is formed in a substantially rectangular shape, as viewed from above, having its longitudinal direction in the column direction. The back-gate holes 22 are formed in a matrix form in the row and column directions.

As illustrated in FIGS. 9 and 10, the memory transistor layer 30 is formed on the back-gate transistor layer 20. The memory transistor layer 30 has word-line conductive layers 31a to 31d. The word-line conductive layers 31a to 31d are laminated with interlayer insulation layers (not illustrated) sandwiched therebetween. The word-line conductive layers 31a to 31d are formed in a stripe pattern extending in the row direction at a certain pitch in the column direction. The word-line conductive layers 31a to 31d comprise polysilicon (p-Si). The word-line conductive layers 31a to 31d function as word lines WL1 to WL8. The word-line conductive layers 31a to 31d function as the control gates of memory transistors MTr1 to MTr8.

As illustrated in FIG. 10, the memory transistor layer 30 has a memory hole 32. The memory hole 32 is formed to penetrate the word-line conductive layers 31a to 31d. The memory hole 32 is formed at a position matching near each end in the column direction of the back-gate hole 22.

In addition, as illustrated in FIG. 10, the back-gate transistor layer 20 and the memory transistor layer 30 have a block insulation layer 33a, an electric charge storage layer 33b, a tunnel insulation layer 33c, and a U-shaped semiconductor layer 34. The U-shaped semiconductor layer 34 functions as the body of a memory string MS.

As illustrated in FIG. 10, the block insulation layer 33a is formed with a certain thickness on a sidewall of the back-gate hole 22 and the memory hole 32. The electric charge storage layer 33b is formed with a certain thickness on a side surface of the block insulation layer 33a. The tunnel insulation layer 33c is formed with a certain thickness on a side surface of the electric charge storage layer 33b. The U-shaped semiconductor layer 34 is formed in contact with a side surface of the tunnel insulation layer 33c. The U-shaped semiconductor layer 34 is formed to fill up the back-gate hole 22 and the memory hole 32. The U-shaped semiconductor layer 34 is formed in a U-shape as viewed from the row direction. The U-shaped semiconductor layer 34 has a pair of columnar portions 34a extending in a vertical direction to the substrate 10 and a joining portion 34b joining the lower ends of the pair of columnar portions 34a.

The block insulation layers 33a and the tunnel insulation layers 33c comprise silicon oxide ($SiO_2$). The electric charge storage layers 33b comprise silicon nitride (SiN). The U-shaped semiconductor layers 34 comprise polysilicon (p-Si). The block insulation layers 33a, the electric charge storage layers 33b, the tunnel insulation layers 33c, and the U-shaped semiconductor layers 34 function as the MONOS of the memory transistors MTr1 to MTr8.

The above-mentioned configuration of the back-gate transistor layer 20 is restated as follows: the tunnel insulation layer 33c is formed to surround the joining portion 34b. The back-gate conductive layer 21 is formed to surround the joining portion 34b.

The above-mentioned configuration of the memory transistor layer 30 is restated as follows: the tunnel insulation layer 33c is formed to surround the columnar portions 34a. The electric charge storage layer 33b is formed to surround the tunnel insulation layer 33c. The block insulation layer 33a is formed to surround the electric charge storage layer 33b. The word-line conductive layers 31a to 31d are formed to surround the block insulation layer 33a and the columnar portions 34a.

As illustrated in FIGS. 9 and 10, the selection transistor layer 40 has a source-side conductive layer 41a and a drain-side conductive layer 41b. The source-side conductive layers 41a and the drain-side conductive layers 41b are formed in a stripe pattern extending in the row direction at a certain pitch in the column direction. A pair of source-side conductive layers 41a and a pair of drain-side conductive layers 41b are alternately positioned in the column direction. Each source-side conductive layer 41a is formed above one of the columnar portions 34a included in a respective U-shaped semiconductor layer 34, while each drain-side conductive layer 41b is formed above the other of the columnar portions 34a included in the U-shaped semiconductor layer 34.

The source-side conductive layers 41a and the drain-side conductive layers 41b comprise polysilicon (p-Si). Each source-side conductive layer 41a functions as a source-side selection gate line SGS. Each source-side conductive layer 41a also functions as the control gate of a source-side selection transistor SSTr. Each drain-side conductive layer 41b functions as a drain-side selection gate line SGD. Each drain-side conductive layer 41b also functions as the control gate of a drain-side selection transistor SDTr.

As illustrated in FIG. 10, the selection transistor layer 40 has a source-side hole 42a and a drain-side hole 42b. The source-side hole 42a is formed to penetrate the source-side conductive layer 41a. The source-side hole 42a is formed at a position matching the memory hole 32. The drain-side hole 42b is formed to penetrate the drain-side conductive layer 41b. The drain-side hole 42b is formed at a position matching the memory hole 32.

As illustrated in FIG. 10, the selection transistor layer 40 has a source-side gate insulation layer 43a, a source-side columnar semiconductor layer 44a, a drain-side gate insulation layer 43b, and a drain-side columnar semiconductor layer 44b. The source-side gate insulation layer 43a is formed on a sidewall of the source-side hole 42a. The source-side columnar semiconductor layer 44a is formed in a columnar shape extending in a vertical direction to the substrate 10 and in contact with the source-side gate insulation layer 43a. The drain-side gate insulation layer 43b is formed on a sidewall of the drain-side hole 42b. The drain-side columnar semiconductor layer 44b is formed in a columnar shape extending in a vertical direction to the substrate 10 and in contact with the drain-side gate insulation layer 43b.

The source-side gate insulation layers 43a and the drain-side gate insulation layers 43b comprise silicon oxide ($SiO_2$). The source-side columnar semiconductor layers 44a and the drain-side columnar semiconductor layers 44b comprise polysilicon (p-Si).

The above-mentioned configuration of the selection transistor layer 40 is restated as follows: the source-side gate insulation layer 43a is formed to surround the source-side columnar semiconductor layer 44a. The source-side conductive layer 41a is formed to surround the source-side gate insulation layer 43a and the source-side columnar semiconductor layer 44a. The drain-side gate insulation layer 43b is formed to surround the drain-side columnar semiconductor layer 44b. The drain-side conductive layer 41b is formed to surround the drain-side gate insulation layer 43b and the drain-side columnar semiconductor layer 44b.

As illustrated in FIGS. 9 and 10, the wiring layer 50 is formed on the selection transistor layer 40. The wiring layer 50 has a source-line layer 51, a plug layer 52, and a bit-line layer 53. The source-line layer 51 is formed in a plate-like form extending in the row direction. The source-line layer 51 is formed in contact with the top surfaces of a pair of source-side columnar semiconductor layers 44a adjacent in the column direction. The plug layer 52 is formed to come in contact with the top surface of the drain-side columnar semiconductor layer 44b and extend in a vertical direction to the substrate 10. The bit-line layers 53 are formed in a stripe pattern extending in the column direction at a certain pitch in the row direction. The bit-line layers 53 are formed in contact with the top surface of the plug layers 52. The source-line layers 51, the plug layers 52, and the bit-line layers 53 comprise a metal such as tungsten (W). Each source-line layer 51 functions as a source line SL (a first source line SLA). Each bit-line layer 53 functions as a bit line BL.

(Overview of Erase Operation of Non-Volatile Semiconductor Storage Device in First Embodiment)

Figure 11:
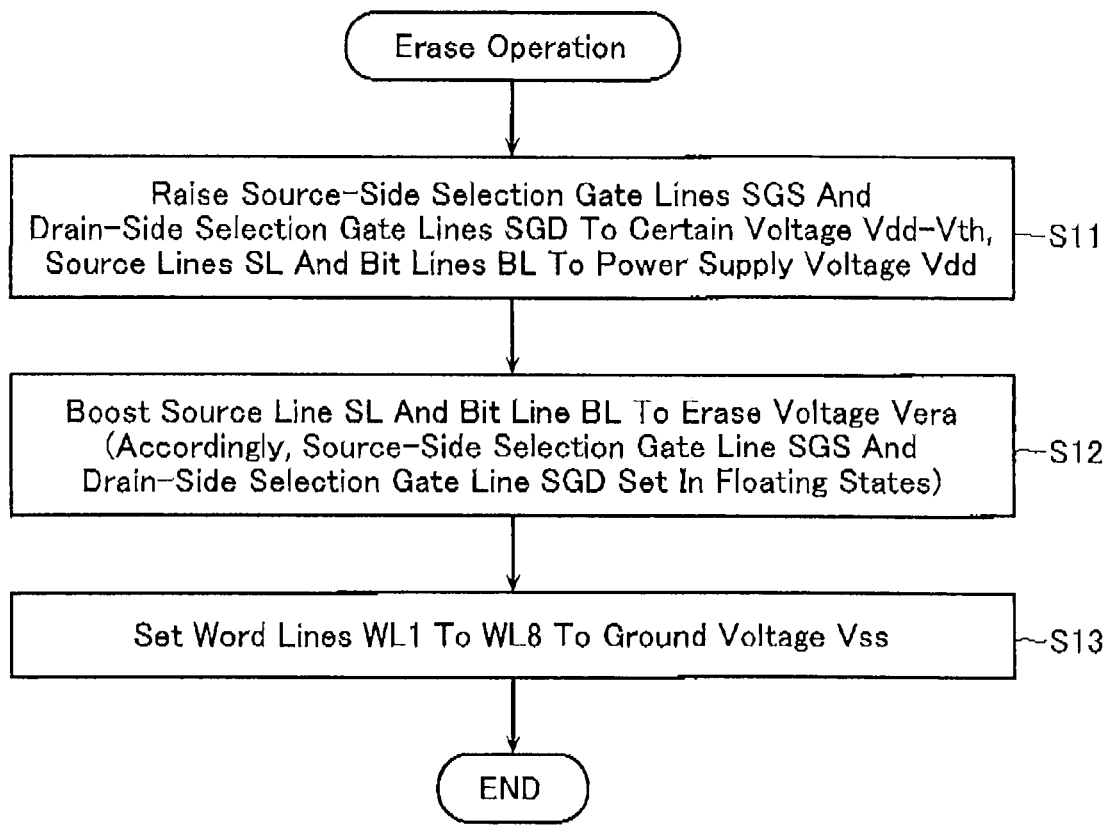
FIG. 11 is a flowchart illustrating an erase operation according to the first embodiment.
Figure 12:
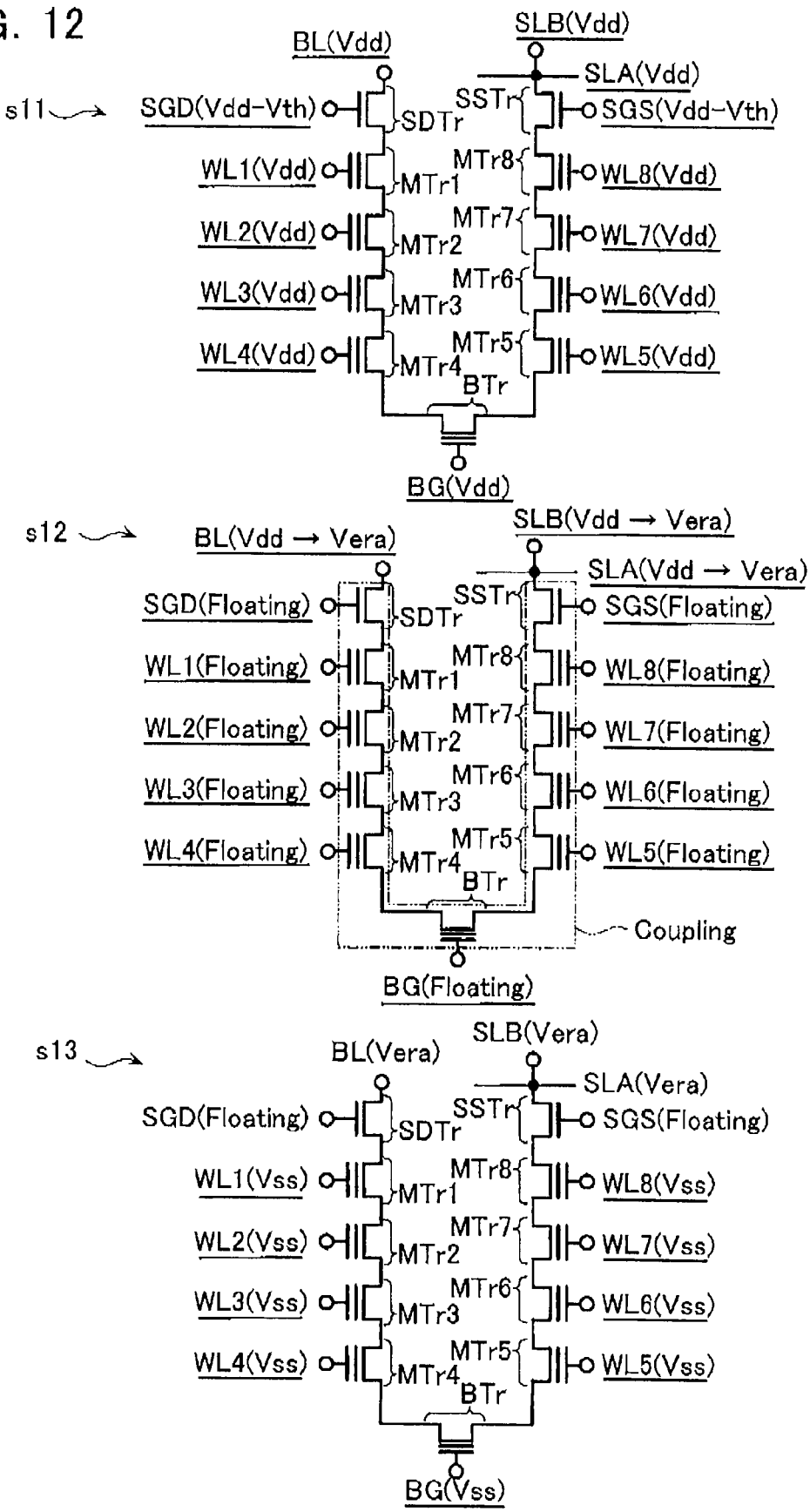
FIG. 12 is a schematic diagram illustrating the erase operation according to the first embodiment.

Referring now to FIGS. 11 and 12, an erase operation of the non-volatile semiconductor storage device according to the first embodiment will be outlined below.

FIG. 11 is a flowchart illustrating an erase operation of the non-volatile semiconductor storage device in the first embodiment. FIG. 12 schematically illustrates the erase operation.

Firstly, as indicated by a label "s11" in FIG. 12, in a selected memory block MB, the control circuit AR2 raises the source-side selection gate lines SGS and the drain-side selection gate lines SGD to a certain voltage Vdd-Vth, as well as the source lines SL and the bit lines BL to a power supply voltage Vdd (step S11). The power supply voltage Vdd is a voltage that is higher than the certain voltage Vdd-Vth by Vth and that causes a GIDL current due to the potential difference Vth.

Figure 13:
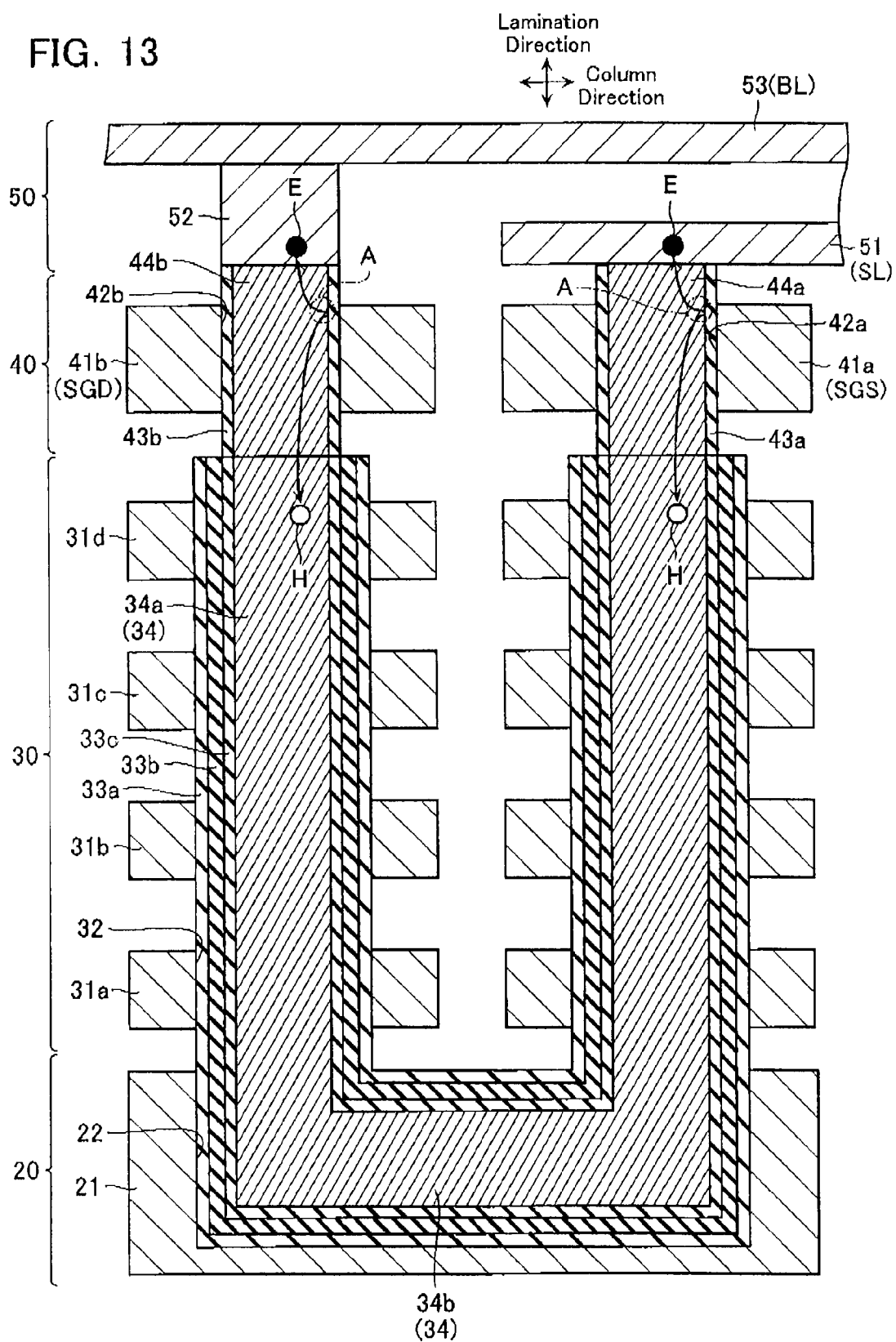
FIG. 13 is a diagram for illustrating the GIDL current according to the first embodiment.

In this case, as indicated by a label "A" in FIG. 13, a GIDL current is caused by creating a higher electric field at the end of the source-side conductive layer 41a (the source-side selection gate line SGS) on the source-line layer 51 (the source line SL) side. In addition, as indicated by another label "A" in FIG. 13, a GIDL current is also caused by creating a higher electric field at the end of the drain-side conductive layer 41b (the drain-side selection gate line SGD) on the bit-line layer 53 (the bit line BL) side. Due to the GIDL currents, holes H and electrons E are generated.

In addition, at step S11, as indicated by the label "s11" in FIG. 12, the control circuit AR2 raises the word lines WL1 to WL8 and the back-gate line BG to the power supply voltage Vdd.

Subsequently, as indicated by a label "s12" in FIG. 12, the control circuit AR2 boosts the source line SL and the bit line BL from the power supply voltage Vdd to an erase voltage Vera (step S12). Note that during the operation at step S12, the other wirings are maintained in the same controlled state as that described in step S11. However, the source-side selection gate line SGS, the drain-side selection gate line SGD, the word lines WL1 to WL8, and the back-gate line BG are set in floating states. Then, the respective potentials of the source-side selection gate line SGS, the drain-side selection gate line SGD, the word lines WL1 to WL8, and the back-gate line BG rise due to the coupling with the body of the memory string MS.

More particularly, at step S12, the control is performed as follows: a potential difference larger than Vth is produced between the source-side selection gate line SGS and the source line SL, as well as between the drain-side selection gate line SGD and the bit line BL. Due to this potential difference, GIDL currents are caused and holes are injected into the body of the memory string MS, raising the body's potential. Then, due to the coupling with the body of the memory string MS, the respective gate potentials of the source-side selection transistor SSTr and the drain-side selection transistor SDTr become higher than the certain voltage Vdd-Vth. Accordingly, the source-side selection gate line SGS and the drain-side selection gate line SGD are set in floating states. Once this cycle starts, the potential of the body of the memory string MS, the potential of the source-side selection gate line SGS, and the potential of the drain-side selection gate line SGD become higher as the potentials of the source line SL and the bit line BL rise.

After execution of the operation at step S12, and when the source line SL and the bit line BL reach the erase voltage Vera, as indicated by a label "s13" in FIG. 12, the control circuit AR2 sets the word lines WL1 to WL8 and the back-gate line BG at the ground voltage Vss (step S13), and feeds the holes H caused by the GIDL currents into the gates of the memory transistors MTr1 to MTr8. In this way, data is erased.

(Specific Erase Operation of Non-Volatile Semiconductor Storage Device in First Embodiment)

Figure 14A:
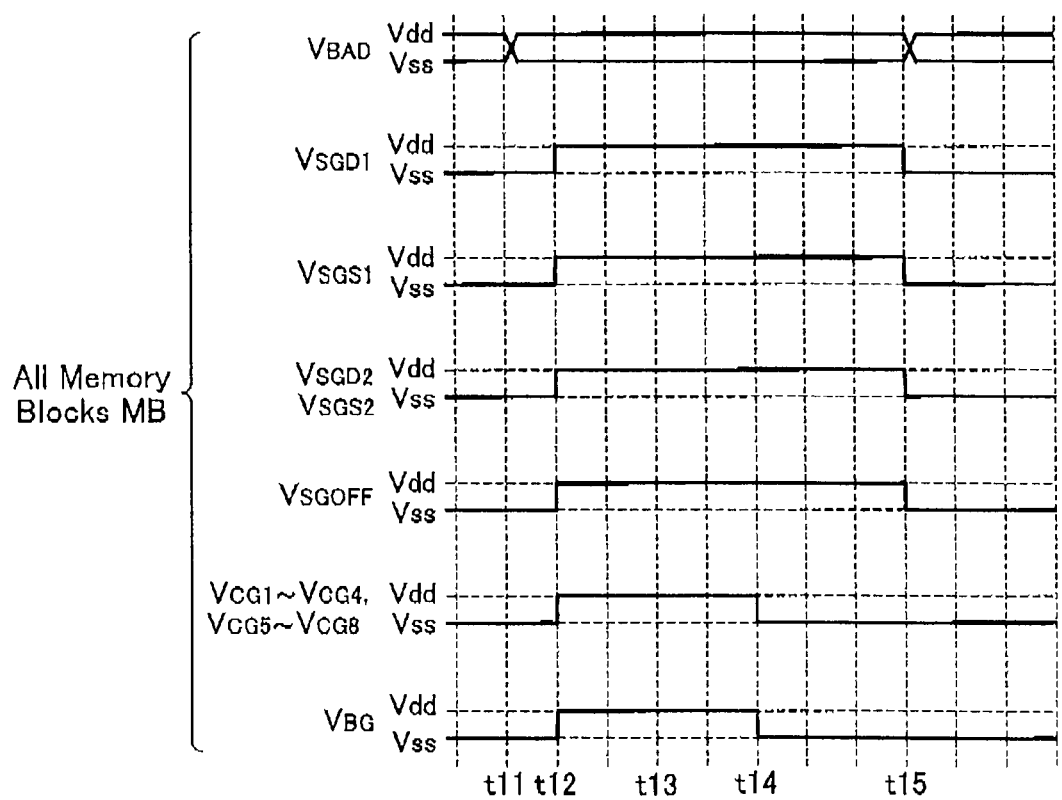
FIG. 14A is a timing chart illustrating an erase operation according to the first embodiment.
Figure 14B:
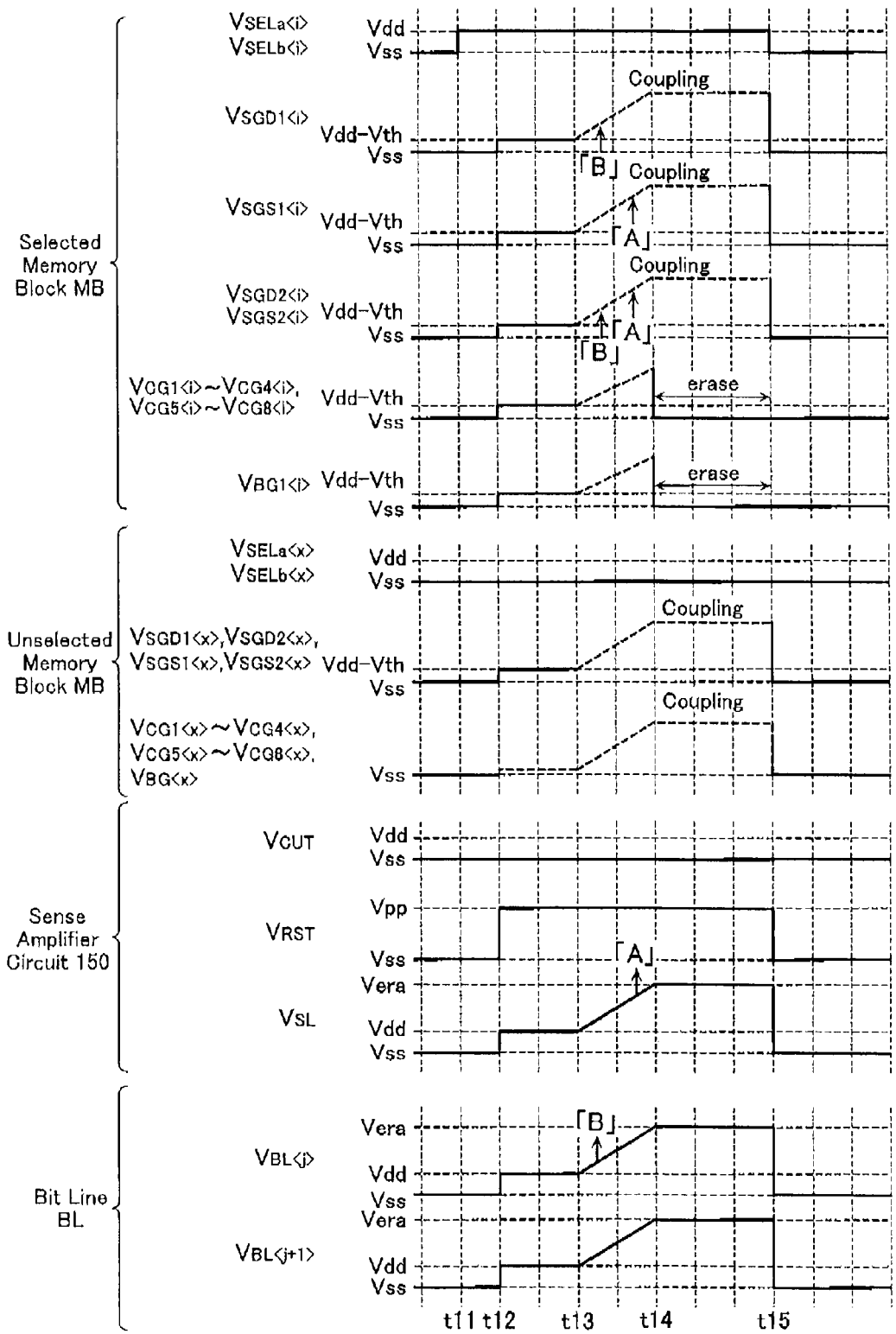
FIG. 14B is a timing chart illustrating the erase operation according to the first embodiment.

Referring now to FIGS. 14A and 14B, a specific erase operation of the non-volatile semiconductor storage device according to the first embodiment will be described below. FIGS. 14A and 14B are timing charts illustrating an erase operation.

Firstly, at time t11, a signal $V_{BAD}$ is inverted as illustrated in FIG. 14A.

As illustrated in FIG. 14B, due to the change of the signal $V_{BAD}$, at time t11, signals $V_{SELa<i>}$ and $V_{SELb<i>}$ rise from the ground voltage Vss to the power supply voltage Vdd in the selected memory block MB. That is, the first transfer transistors 181*a* to 186*a* (181*b* to 187*b*) are set in ON states. On the other hand, the ground voltage Vss is applied to the gates of the second transfer transistors 187*a* and 188*a* (188*b* and 189*b*). This allows the second transfer transistors 187*a* and 188*a* (188*b* and 189*b*) to be set in OFF states. Through this operation, in the selected memory block MB, the word lines WL1 to WL4 and WL5 to WL8 are connected to the word-line driving circuits 110*a* and 110*b* via the first transfer transistors 181*a* to 184*a* and 181*b* to 184*b*, respectively. In addition, the source-side selection gate line SGS and the drain-side selection gate line SGD are connected to the selection-gate-line driving circuits 120*a* and 120*b* via the first transfer transistors 185*a*, 186*a*, 185*b*, and 186*b*. Furthermore, the back-gate line BG is connected to the back-gate-line driving circuit 170 via the first transfer transistor 187*b*.

In contrast, as illustrated in FIG. 14B, due to the change of the signal $V_{BAD}$, at time t11, the signals $V_{SELa<x>}$ and $V_{SELb<x>}$ are maintained at the voltage Vss in the unselected memory blocks MB. That is, the first transfer transistors 181*a* to 186*a* (181*b* to 187*b*) are maintained in the OFF states. On the other hand, the voltage VDD is applied to the gates of the second transfer transistors 187*a* and 188*a* (188*b* and 189*b*). This allows the second transfer transistors 187*a* and 188*a* (188*b* and 189*b*) to be set in ON states. Through this operation, the word lines WL1 to WL4 and WL5 to WL8 are set in floating states in the unselected memory blocks MB. In addition, the source-side selection gate line SGS and the drain-side selection gate line SGD are connected to the selection-gate-line driving circuits 120*a* and 120*b* via the second transfer transistors 188*a*, 187*a*, 188*b*, and 189*b*. Furthermore, the back-gate line BG is set in a floating state.

Then, as illustrated in FIG. 14A, at time t12, the signals $V_{SGS1}$, $V_{SGS2}$, $V_{SGD1}$, $V_{SGD2}$, $V_{SGOFF}$, $V_{CG1}$ to $V_{CG8}$, and $V_{BG}$ are raised from the ground voltage Vss to the power supply voltage Vdd.

As illustrated in FIG. 14B, at time t12, due to the change of the signals $V_{SGS1}$, $V_{SGS2}$, $V_{SGD1}$, $V_{SGD2}$, $V_{SGOFF}$, $V_{CG1}$ to $V_{CG8}$, and $V_{BG}$, the signals $V_{SGD1<i>}$, $V_{SGD2<i>}$, $V_{SGS1<i>}$, $V_{SGS2<i>}$, $V_{CG1<i>}$ to $V_{CG8<i>}$, and $V_{BG<i>}$ are raised to a certain voltage Vdd-Vth in the selected memory block MB.

On the other hand, as illustrated in FIG. 14B, at time t12, due to the change of the signals $V_{SGD1}$, $V_{SGS2}$, $V_{SGD1}$, $V_{SGD2}$, $V_{SGOFF}$, $V_{CG1}$ to $V_{CG8}$, and $V_{BG}$, the signals $V_{SGD1<x>}$, $V_{SGD2<x>}$, $V_{SGS1<x>}$, and $V_{SGS2<x>}$ are raised to the certain voltage Vdd-Vth in the unselected memory blocks MB.

In addition, as illustrated in FIG. 14B, at time t12, the signal $V_{SL}$ is raised to the power supply voltage Vdd at the source-line driving circuit 160. Furthermore, at time t12, the signal VRST is raised to a voltage Vpp at the sense amplifier circuit 150. Due to the change of the signal VRST, at time t12, the voltage of the signal $V_{BL}$ is set at the power supply voltage Vdd.

Subsequently, as illustrated in FIG. 14B, at time t13, the signal $V_{SL}$ begins to rise toward the erase voltage Vera at the source-line driving circuit 160. Accordingly, the signal $V_{BL}$ also begins to rise toward the erase voltage Vera.

Through the above-mentioned control at time t13, as indicated by labels "A" and "B" in FIG. 14B, the potentials of the signals $V_{SGS1<i>}$, $V_{SGS2<i>}$, $V_{SGD1<i>}$, and $V_{SGD2<i>}$ become higher as the signals $V_{SL}$ and $V_{BL}$ are boosted, due to the coupling with the body of the memory string MS. Then, from time t13, GIDL currents are caused due to the potential differences between the signal $V_{SL}$ and the signals $V_{SGS1}$, $V_{SGS2}$, as well as between the signal $V_{BL}$ and the signals $V_{SGD1}$, $V_{SGD2}$.

Then, as illustrated in FIG. 14B, at time t14, the signal $V_{SL}$ is set at the erase voltage Vera. Accordingly, as illustrated in FIG. 14A, the signals $V_{CG1}$ to $V_{CG8}$ and $V_{BG}$ are set at the ground voltage Vss in the selected memory block MB. That is, at time t14, the transfer transistor 112B illustrated in FIG. 3 is set in an "ON" state.

As illustrated in FIG. 14B, due to the change of the signals $V_{CG1}$ to $V_{CG8}$ and $V_{BG}$, at time t14, the signals $V_{CG1<i>}$ to $V_{CG8<i>}$ and $V_{BG<i>}$ are set at the ground voltage Vss in the selected memory block MB. Through the control at time t14, the holes H caused by the GIDL currents are fed into the gates of the memory transistors MTr1 to MTr8, after which execution of the erase operation begins.

Subsequently, at time t15, all of the signals are set at the ground voltage Vss as illustrated in FIG. 14A. Thus, as illustrated in FIG. 14B, all of the signals are set at the ground voltage Vss at time t15. That is, the erase operation ends at time t15.

(Advantages of Non-Volatile Semiconductor Storage Device in First Embodiment)

Advantages of the non-volatile semiconductor storage device according to the first embodiment will now be described below. As described above, the non-volatile semiconductor storage device in the first embodiment raises the source-side selection gate line SGS and the drain-side selection gate line SGD to the certain voltage Vdd-Vth, as well as the source line SL and the bit line BL to the power supply voltage Vdd. Thereafter, the non-volatile semiconductor storage device starts boosting the source line SL and the bit line BL to the erase voltage Vera.

Through these operations, the following cycle will occur: (1) the source line SL and the bit line BL are boosted; (2) GIDL currents are caused between the source line SL and the source-side selection gate line SGS, as well as between the bit line BL and the drain-side selection gate line SGD; (3) the potential of the body of the memory string MS rises; and (4) the respective potentials of the source-side selection gate line SGS and the drain-side selection gate line SGD rise due to the coupling with the body of the memory string MS. Through the above-mentioned cycle (1) to (4), the potential of the body of the memory string MS, the potential of the source-side selection gate line SGS, and the potential of the drain-side selection gate line SGD also rise.

With the GIDL currents caused by the above-mentioned operations, the non-volatile semiconductor storage device in the first embodiment may achieve efficient data erase operation.

In addition, because of the configuration described above, the non-volatile semiconductor storage device in the first embodiment does not need to boost the corresponding source-side selection gate line SGS and drain-side selection gate line SGD in time with the source line SL and the bit line BL being boosted. That is, this non-volatile semiconductor storage device does not require any circuits for controlling the timing when source-side selection gate lines SGS and drain-side selection gate lines SGD are boosted. Therefore, it may suppress the increase in its occupation area.

Second Embodiment

Configuration of Non-Volatile Semiconductor Storage Device in Second Embodiment

Figure 15:
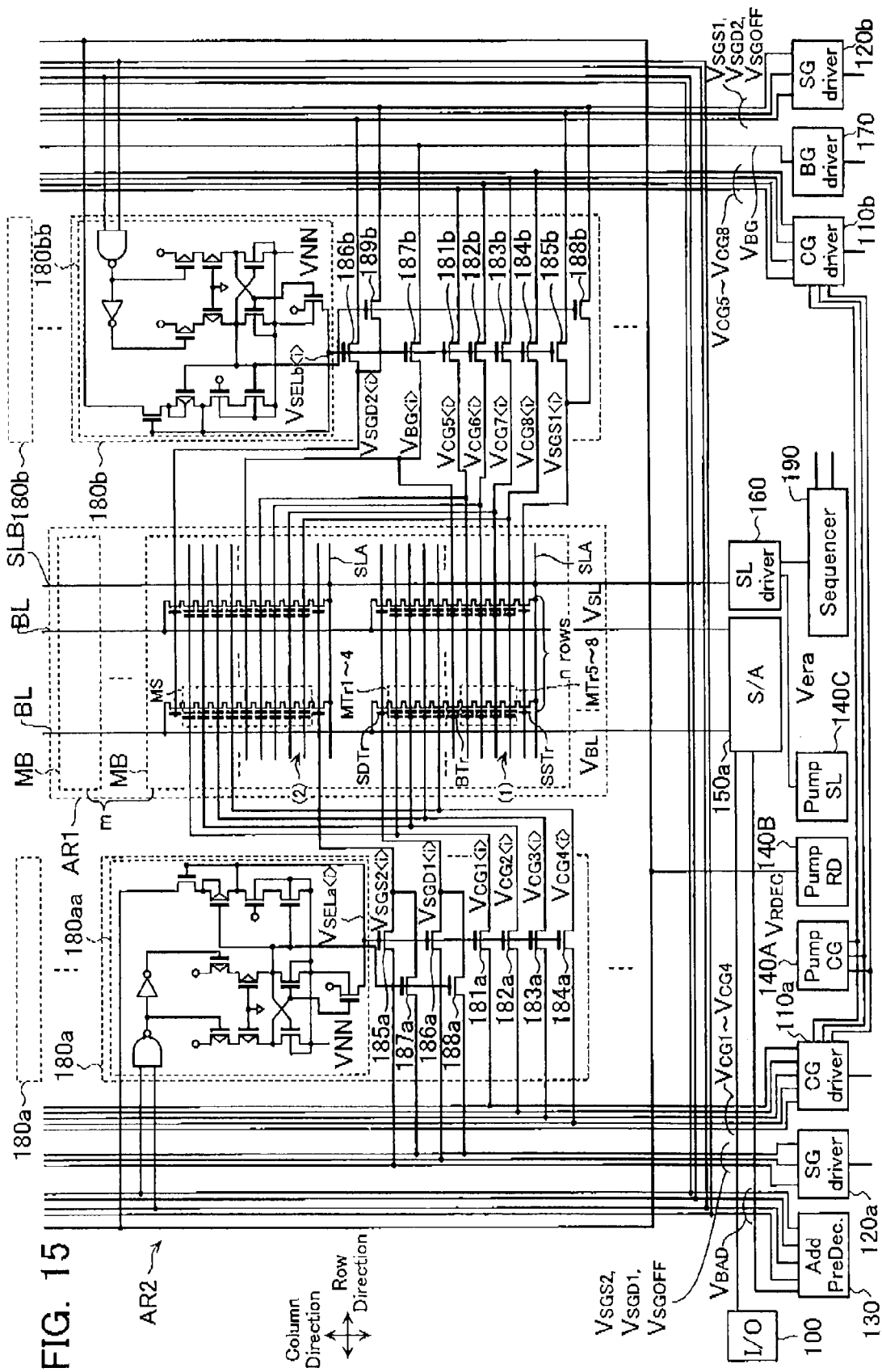
FIG. 15 is a circuit diagram of a non-volatile semiconductor storage device according to a second embodiment.
Figure 16:
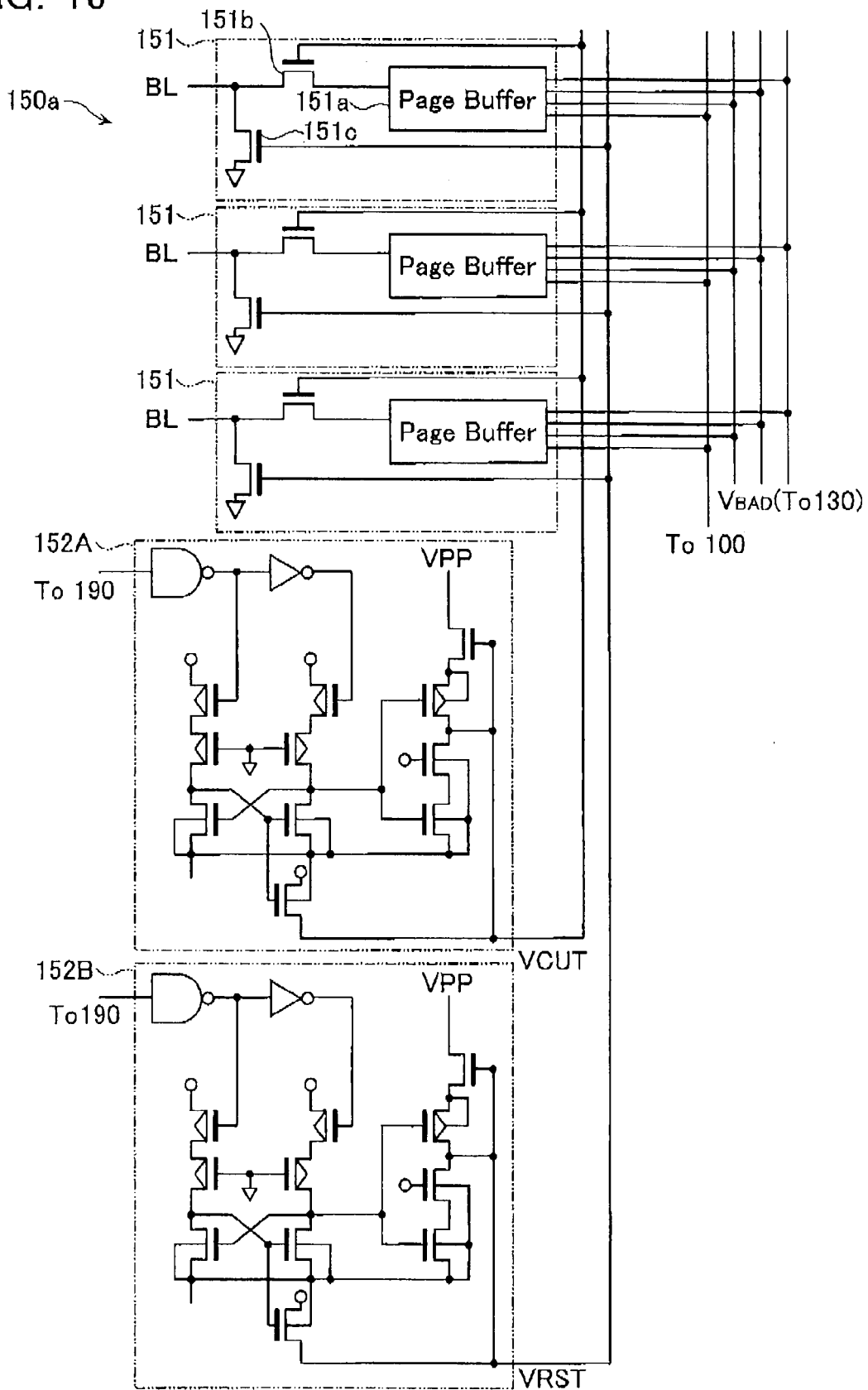
FIG. 16 is a circuit diagram of a sense amplifier circuit 150a according to the second embodiment.

Referring now to FIGS. 15 and 16, a configuration of a non-volatile semiconductor storage device according to a second embodiment will be described below. FIG. 15 is a circuit diagram of the non-volatile semiconductor storage device according to the second embodiment. FIG. 16 is a circuit diagram of a sense amplifier circuit 150a according to the second embodiment. Note that the same reference numerals represent the same components as the first embodiment, and description thereof will be omitted in the second embodiment.

As illustrated in FIG. 15, the non-volatile semiconductor storage device in the second embodiment is only different from the first embodiment in the sense amplifier circuit 150a.

As illustrated in FIG. 16, what is the only difference from the first embodiment is the connection of each transistor 151c included in the sense amplifier circuit 150a according to the second embodiment. Each transistor 151c has one end connected to a bit line BL and the other end to the ground.

(Erase Operation of Non-Volatile Semiconductor Storage Device in Second Embodiment)

Figure 17:
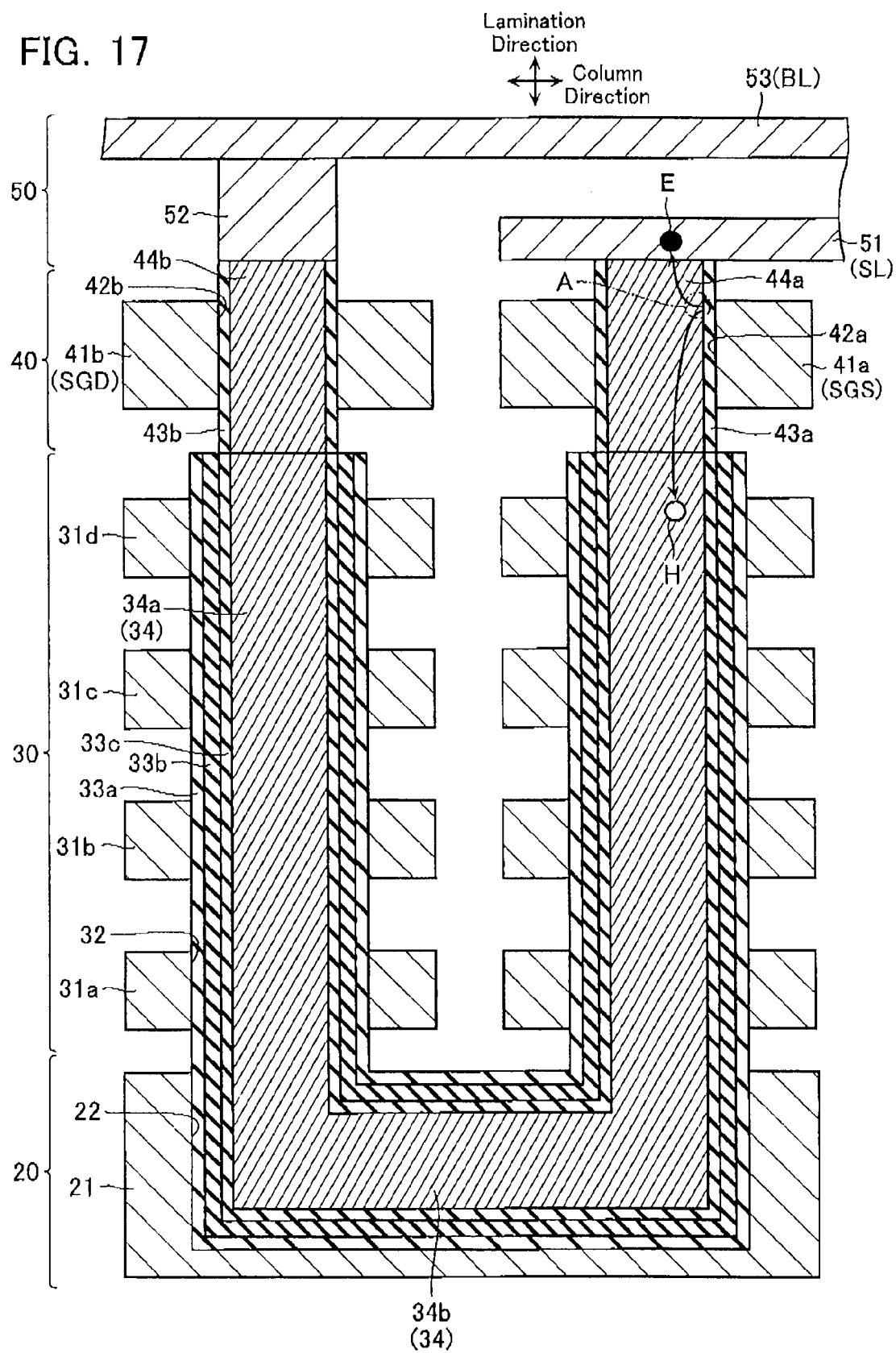
FIG. 17 is a diagram for illustrating the GIDL current according to the second embodiment.
Figure 18:
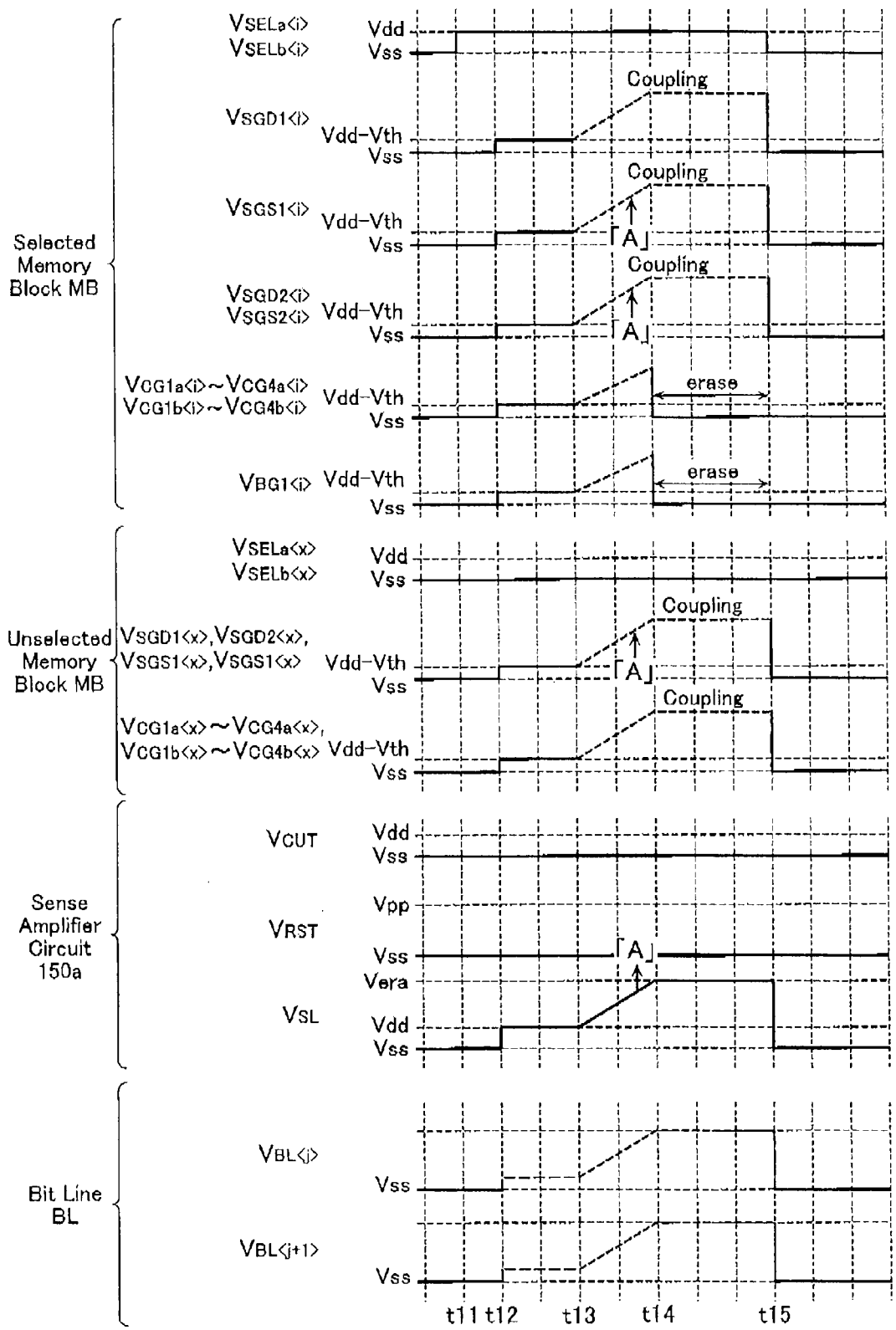
FIG. 18 is a timing chart illustrating an erase operation according to the second embodiment.

Referring now to FIGS. 17 and 18, an erase operation of the non-volatile semiconductor storage device according to the second embodiment will be described below. FIG. 17 is a diagram for illustrating a GIDL current according to the second embodiment; and FIG. 18 is a timing chart illustrating an erase operation thereof.

Unlike the first embodiment, in erase operation of the second embodiment, a GIDL current is caused by creating a higher electric field at the end of the source-side conductive layer 41a (a source-side selection gate line SGS) on the source-line layer 51 (the source line SL) side, as indicated by a label "A" in FIG. 17. That is, according to the second embodiment, as indicated by time t12 to t15 in FIG. 18, the voltage of the source line SL is only controlled, without controlling the voltage of the bit line BL. The erase operation in the second embodiment is otherwise the same as that described in the first embodiment.

(Advantages of Non-Volatile Semiconductor Storage Device in Second Embodiment)

The non-volatile semiconductor storage device according to the second embodiment has the same features and advantages as the first embodiment.

Third Embodiment

Configuration of Non-Volatile Semiconductor Storage Device in Third Embodiment

Figure 19:
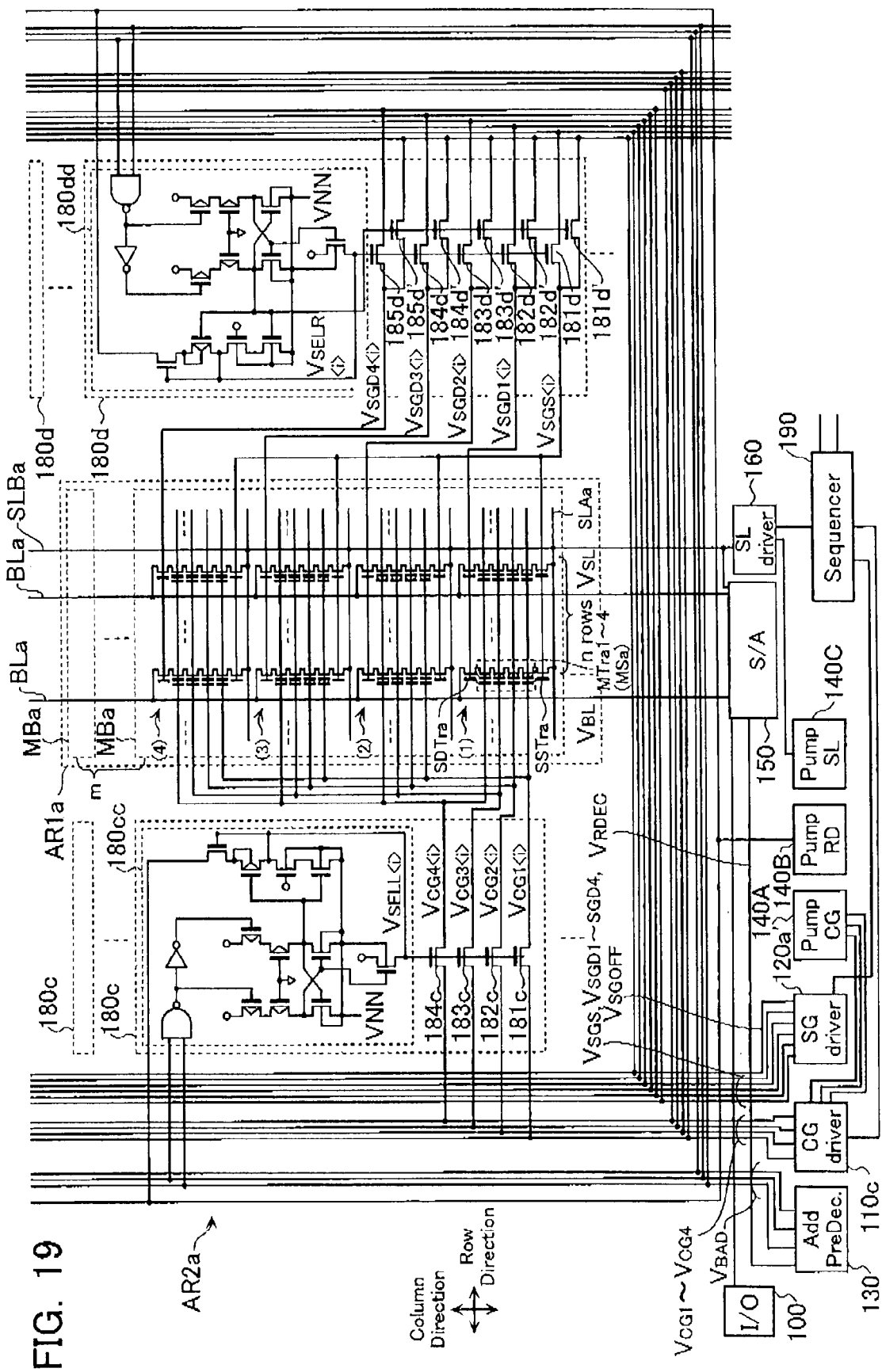
FIG. 19 is a circuit diagram of a non-volatile semiconductor storage device according to a third embodiment.

Referring now to FIG. 19, a configuration of a non-volatile semiconductor storage device according to a third embodiment will be described below. FIG. 19 is a circuit diagram of the non-volatile semiconductor storage device in the third embodiment. Note that the same reference numerals represent the same components as the first and second embodiments, and description thereof will be omitted in the third embodiment.

As illustrated in FIG. 19, the non-volatile semiconductor storage device in the third embodiment has a memory cell array AR1a and a control circuit ARa2 that are different from the first and second embodiments.

As illustrated in FIG. 19, the memory cell array AR1a has m columns of memory blocks MBa. Each memory block MBa comprises n rows and 4 columns of memory strings MSa, source-side selection transistors SSTra each connected to one end of the memory string MSa, and drain-side selection transistors SDTra each connected to the other end of the memory string MSa. Note that in the example of FIG. 19, the first column is denoted by (1), the second column by (2), the third column by (3), and the fourth column by (4).

Figure 20:
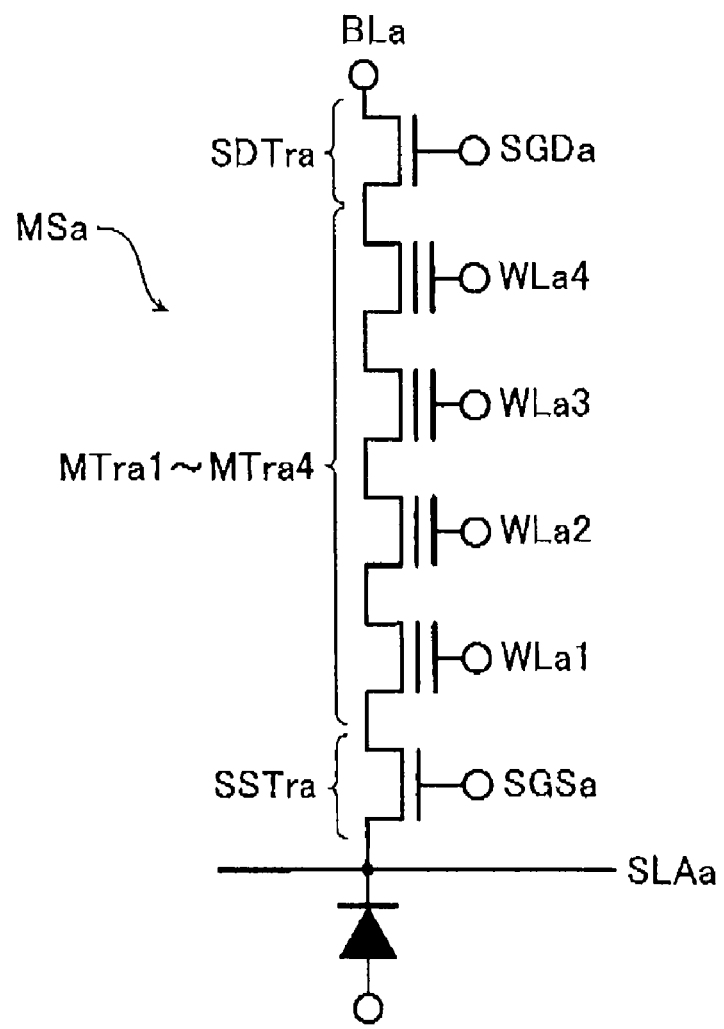
FIG. 20 is a circuit diagram of one memory string MSa according to the third embodiment.

As illustrated in FIG. 20, each memory string MSa has memory transistors MTra1 to MTra4. The memory transistors MTra1 to MTra4 are connected in series. The memory transistors MTra1 to MTra4, which include a MONOS structure, cause electric charges to be accumulated in respective control gates.

As illustrated in FIG. 20, the control gates of the memory transistors MTra1 to MTra4 are connected to word lines WLa1 to WLa4. The word lines WLa1 to WLa4 are provided in common to the control gates of respective memory transistors MTra1 to MTra4 aligned in a matrix form in the row and column directions.

As illustrated in FIG. 20, the drain of each source-side selection transistor SSTra is connected to the source of a memory transistor MTra1. The source of each source-side selection transistor SSTra is connected to a first source line SLAa. The control gate of each source-side selection transistor SSTra is connected to a source-side selection gate line SGSa.

As illustrated in FIG. 19, each first source line SLAa is provided in common to the sources of the source-side selection transistors SSTra aligned in the row direction, and formed to extend in the row direction across a plurality of memory strings MSa. The first source lines SLAa aligned in the column direction are commonly connected to a single second source line SLBa extending in the column direction. Each source-side selection gate line SGSa is provided in common to the control gates of the source-side selection transistors SSTra aligned in a matrix form in the row and column directions.

As illustrated in FIG. 20, one end of each drain-side selection transistor SDTra is connected to one end of a memory transistor MTra4. The other end of each drain-side selection transistor SDTra is connected to a bit line BLa. The control gate of each drain-side selection transistor SDTra is connected to a drain-side selection gate line SGDa.

As illustrated in FIG. 19, each bit line BLa is provided in common to one ends of the drain-side selection transistors SDTra aligned in the column direction, and formed to extend in the column direction across a plurality of memory blocks MBa. Each drain-side selection gate line SGDa is provided in common to the control gates of the drain-side selection transistors SDTra aligned in the row direction, and formed to extend in the row direction across a plurality of memory strings MSa.

As illustrated in FIG. 19, a control circuit AR2a has an input/output circuit 100, a word-line driving circuit 110c, a selection-gate-line driving circuit 120a', an address decoder circuit 130, boost circuits 140A to 140C, a sense amplifier circuit 150, a source-line driving circuit 160, a first row decoder circuit 180c, a second row decoder circuit 180d, and a sequencer 190.

As illustrated in FIG. 19, the word-line driving circuit 110c outputs signals $V_{CG1}$ to $V_{CG4}$ for driving word lines WLa1 to WLa4. The word-line driving circuit 110c has substantially the same configuration as the word-line driving circuits 110a and 110b in the first and second embodiments (see FIG. 3).

The selection-gate-line driving circuit 120a' outputs signals $V_{SGS}$, $V_{SGD1}$ to $V_{SGD4}$, and $V_{SGOFF}$. The signal $V_{SGS}$ is used in driving a source-side selection gate line SGSa in a selected memory block MBa. The signals $V_{SGD1}$ to $V_{SGD4}$ are used in driving drain-side selection gate lines SGDa1 to SGDa4 in a selected memory block MBa. The signal $V_{SGOFF}$ is used in driving source-side selection gate lines SGSa and drain-side selection gate lines SGDa1 to SGDa4 in unselected memory blocks MBa.

The first and second row decoder circuits 180c and 180d are provided, one for each memory block MBa, respectively. Each first row decoder circuit 180c is provided at one end in the row direction of a respective memory block MBa. Each second row decoder circuits 180d is provided at the other end in the row direction of a respective memory block MBa.

Each first row decoder circuit 180c selectively inputs signals $V_{CG1<i>}$ to $V_{CG4<i>}$ to the gates of memory transistors MTra1 to MTra4, based on a signal $V_{BAD}$ output from the address decoder circuit 130.

Each first row decoder circuit 180c has a voltage conversion circuit 180 cc and first transfer transistors 181c to 184c. The voltage conversion circuit 180 cc generates a signal $V_{SELL<i>}$ based on the received signals $V_{BAD}$ and $V_{RDEC}$, which in turn is output to the gates of the first transfer transistors 181c to 184c.

The gates of the first transfer transistors 181c to 184c receive the signal $V_{SELL<i>}$ from the voltage conversion circuit 180 cc. The first transfer transistors 181c to 184c are connected between the word-line driving circuit 110c and the word lines WLa1 to WLa4. The first transfer transistors 181c to 184c output signals $V_{CG1<1>}$ to $V_{CG4<i>}$ to the word lines WLa1 to WLa4 based on the signals $V_{CG1}$ to $V_{CG4}$ and $V_{SELL<i>}$.

Each second row decoder circuit 180d selectively inputs a signal $V_{SGS<i>}$ to the gates of four columns of source-side selection transistors SSTra in common, based on the signal $V_{BAD}$ output from the address decoder circuit 130. In addition, based on the signal $V_{BAD}$, the second row decoder circuit 180d selectively inputs signals $V_{SGD1<i>}$ to $V_{SGD4<i>}$ to the gates of the drain-side selection transistors SDTra in the first to fourth columns.

Each second row decoder circuit 180d has a voltage conversion circuit 180dd, first transfer transistors 181d to 185d, and second transfer transistors 181d' to 185d'. The voltage conversion circuit 180dd generates a signal $V_{SELR<i>}$ based on the voltages of the received signals $V_{BAD}$ and $V_{RDEC}$, and outputs it to the gates of the first transfer transistors 181d to 185d. In addition, the voltage conversion circuit 180dd controls the gates of the second transfer transistors 181d' to 185d' based on the received signals $V_{BAD}$ and $V_{RDEC}$.

The gates of the first transfer transistors 181d to 185d receive the signal $V_{SELR<i>}$ from the voltage conversion circuit 180dd. The first transfer transistor 181d is connected between the selection-gate-line driving circuit 120a' and a source-side selection gate line SGSa. In addition, the first transfer transistors 182d to 185d are connected between the selection-gate-line driving circuit 120a' and the drain-side selection gate lines SGDa aligned in tour columns, respectively. The first transfer transistor 181d inputs a signal $V_{SGS<i>}$ to the source-side selection gate line SGSa based on the signals $V_{SGS}$ and $V_{SELR<i>}$. In addition, the first transfer transistors 182d to 185d input signals $V_{SGD1<i>}$ to $V_{SGD4<i>}$ to the drain-side selection gate lines SGDa aligned in four columns based on the signals $V_{SGD1}$ to $V_{SGD4}$ and $V_{SELR<i>}$.

The gates of the second transfer transistors 181d' to 185d' receive a signal from the voltage conversion circuit 180dd. The second transfer transistor 181d' is connected between the selection-gate-line driving circuit 120a' and the source-side selection gate line SGSa. In addition, the second transfer transistors 182d' to 185d' are connected between the selection-gate-line driving circuit 120a' and the drain-side selection gate lines SGDa aligned in four columns. The second transfer transistor 181d' inputs a signal $V_{SGS<i>}$ to the source-side selection gate line SGSa based on the signal $V_{SGOFF}$. In addition, based on the signal $V_{SGOFF}$, the second transfer transistors 182d' to 185d' input signals $V_{SGD1<i>}$ to $V_{SGD4<i>}$ to the drain-side selection gate lines SGDa aligned in four columns.

(Lamination Structure of Non-Volatile Semiconductor Storage Device in Third Embodiment)

Figure 21:
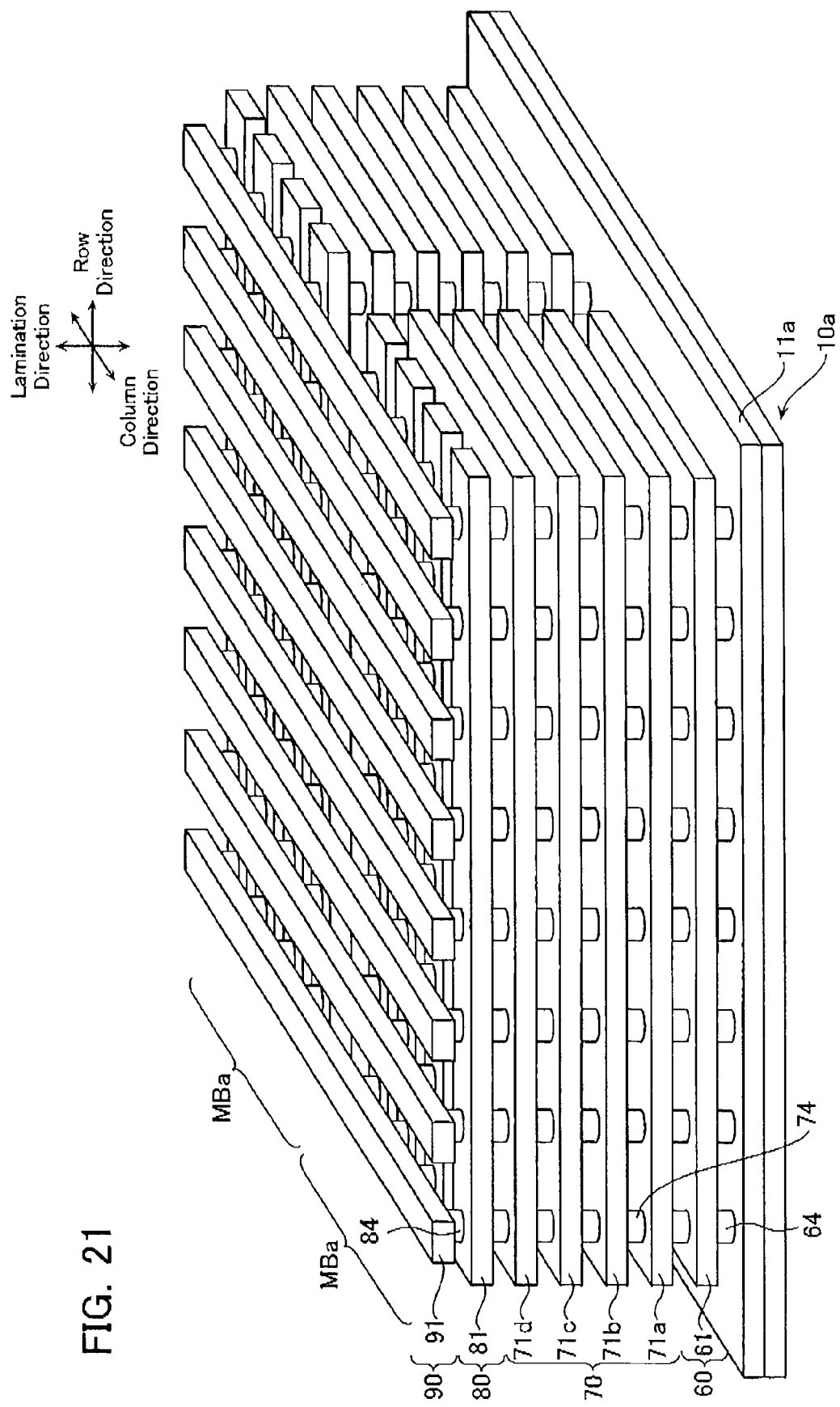
FIG. 21 is a schematic perspective view illustrating a part of a memory cell array AR1a in the non-volatile semiconductor storage device according to the third embodiment.
Figure 22:
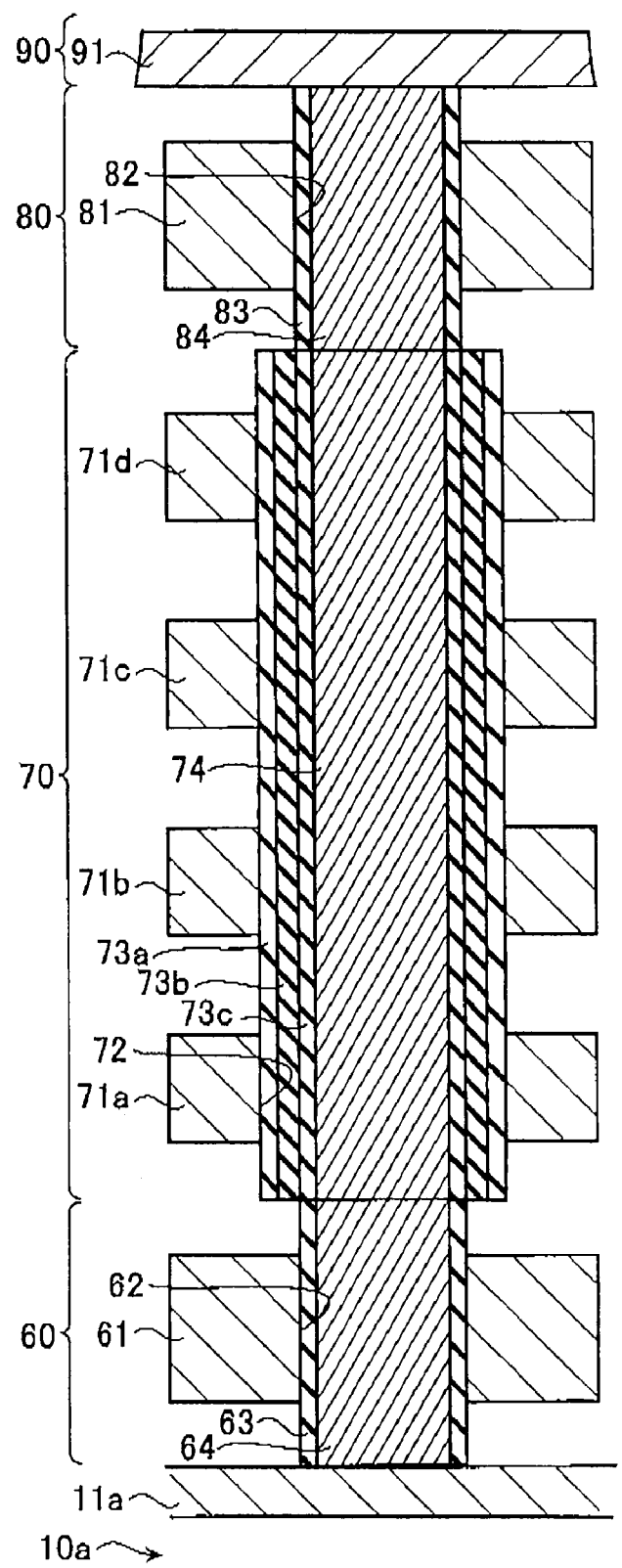
FIG. 22 is a partial cross-sectional view of FIG. 21.

Referring now to FIGS. 21 and 22, a lamination structure of the non-volatile semiconductor storage device according to the third embodiment will be described below. FIG. 21 is a schematic perspective view illustrating a part of a memory cell array AR1a in the non-volatile semiconductor storage device according to the third embodiment. FIG. 22 is a partial cross-sectional view of FIG. 21.

As illustrated in FIG. 21, the memory cell array AR1a is provided on a substrate 10a. The memory cell array AR1a has a source-side selection transistor layer 60, a memory transistor layer 70, a drain-side selection transistor layer 80, and a wiring layer 90. The substrate 10a functions as first source lines SLAa (source lines SLa). The source-side selection transistor layer 60 functions as source-side selection transistors SSTra. The memory transistor layer 70 functions as memory transistors MTra1 to MTra4 (memory strings MSa). The drain-side selection transistor layer 80 functions as drain-side selection transistors SDTra. The wiring layer 90 functions as bit lines BLa.

As illustrated in FIGS. 21 and 22, unlike the first embodiment, the substrate 10a has a diffusion layer 11a on its surface. The diffusion layer 11a functions as first source lines SLAa (source lines SLa).

As illustrated in FIGS. 21 and 22, the source-side selection transistor layer 60 has source-side conductive layers 61. Each source-side conductive layer 61 is formed in a plate-like form expanding in the row and column directions parallel to the substrate 10a. The source-side conductive layers 61 are separated for each memory block MBa.

The source-side conductive layers 61 comprise polysilicon (p-Si). Each source-side conductive layer 61 functions as a source-side selection gate line SGSa. Each source-side conductive layer 61 also functions as the gate of a source-side selection transistor SSTra.

As illustrated in FIG. 22, the source-side selection transistor layer 60 also has a source-side hole 62. The source-side hole 62 is formed to penetrate the source-side conductive layer 61. The source-side holes 62 are formed at positions matching the diffusion layer 11a in a matrix form in the row and column directions.

As illustrated in FIG. 22, the source-side selection transistor layer 60 also has a source-side gate insulation layer 63 and a source-side columnar semiconductor layer 64. The source-side gate insulation layer 63 is formed with a certain thickness on a sidewall of the source-side hole 62. The source-side columnar semiconductor layer 64 is formed to come in contact with a side surface of the source-side gate insulation layer 63 and fill up the source-side hole 62. The source-side columnar semiconductor layer 64 is formed in a columnar shape extending in a vertical direction to the substrate 10a and in contact with the diffusion layer 11a.

The source-side gate insulation layers 63 comprise silicon oxide ($SiO_2$). The source-side columnar semiconductor layers 64 comprise polysilicon (p-Si).

The above-mentioned configuration of the source-side selection transistor layer 60 is restated as follows: the source-side gate insulation layer 63 is formed to surround the source-side columnar semiconductor layer 64. In addition, each source-side conductive layer 61 is formed to surround the source-side gate insulation layer 63.

As illustrated in FIGS. 21 and 22, the memory transistor layer 70 has laminated word-line conductive layers 71a to 71*d*. Each of the word-line conductive layers 71*a* to 71*d* is formed in a plate-like form expanding in the row and column directions parallel to the substrate 10*a*. The word-line conductive layers 71*a* to 71*d* are separated for each memory block MBa.

The word-line conductive layers 71*a* to 71*d* comprise polysilicon (p-Si). The word-line conductive layers 71*a* to 71*d* function as word lines WLa1 to WLa4. The word-line conductive layers 71*a* to 71*d* also function as the gates of memory transistors MTra1 to MTra4.

As illustrated in FIG. 22, the memory transistor layer 70 also has a memory hole 72. The memory hole 72 is formed to penetrate the word-line conductive layers 71*a* to 71*d*. The memory holes 72 are formed at positions matching the source-side holes 62 in a matrix form in the row and column directions.

The memory transistor layer 70 also has a block insulation layer 73*a*, an electric charge storage layer 73*b*, a tunnel insulation layer 73*c*, and a memory columnar semiconductor layer 74. The memory columnar semiconductor layer 74 functions as the body of a memory string MSa.

The block insulation layer 73*a* is formed with a certain thickness on a sidewall of the memory hole 72. The electric charge storage layer 73*b* is formed with a certain thickness on a sidewall of the block insulation layer 73*a*. The tunnel insulation layer 73*c* is formed with a certain thickness on a sidewall of the electric charge storage layer 73*b*. The memory columnar semiconductor layer 74 is formed to come in contact with a sidewall of the tunnel insulation layer 73*c* and fill up the memory hole 72. The memory columnar semiconductor layer 74 is formed to come in contact with the top surface of the source-side columnar semiconductor layer 64 and the bottom surface of a drain-side columnar semiconductor layer 84 described below, and extend in a vertical direction to the substrate 10*a*.

The block insulation layers 73*a* and the tunnel insulation layers 73*c* comprise silicon oxide ($SiO_2$). The electric charge storage layers 73*b* comprise silicon nitride (SiN). The memory columnar semiconductor layers 74 comprise polysilicon (p-Si).

The above-mentioned configuration of the memory transistor layer 70 is restated as follows: the tunnel insulation layer 73*c* is formed to surround the memory columnar semiconductor layer 74. The electric charge storage layer 73*b* is formed to surround the tunnel insulation layer 73*c*. The block insulation layer 73*a* is formed to surround the electric charge storage layer 73*b*. The word-line conductive layers 71*a* to 71*d* is formed to surround the block insulation layer 73*a*.

As illustrated in FIGS. 21 and 22, the drain-side selection transistor layer 80 has a drain-side conductive layer 81. The drain-side conductive layer 81 is formed in a stripe pattern extending in the row direction at a certain pitch in the column direction.

The drain-side conductive layers 81 comprise polysilicon (p-Si). Each drain-side conductive layer 81 functions as a drain-side selection gate line SGDa. Each drain-side conductive layer 81 also functions as the gate of a drain-side selection transistor SDTra.

As illustrated in FIG. 22, the drain-side selection transistor layer 80 also has a drain-side hole 82. The drain-side hole 82 is formed to penetrate the drain-side conductive layer 81. The drain-side holes 82 are formed at positions matching the memory holes 72 in a matrix form in the row and column directions.

As illustrated in FIG. 22, the drain-side selection transistor layer 80 also has a drain-side gate insulation layer 83 and a drain-side columnar semiconductor layer 84. The drain-side gate insulation layer 83 is formed with a certain thickness on a sidewall of the drain-side hole 82. The drain-side columnar semiconductor layer 84 is formed in contact with a sidewall of the drain-side gate insulation layer 83 so as to fill up the drain-side hole 82. The drain-side columnar semiconductor layer 84 is formed to extend in a vertical direction to the substrate 10*a* so as to come in contact with the top surface of the memory columnar semiconductor layer 74.

The drain-side gate insulation layers 83 comprise silicon oxide ($SiO_2$). The drain-side columnar semiconductor layers 84 comprise polysilicon (p-Si).

As illustrated in FIGS. 21 and 22, the wiring layer 90 has a bit-line layer 91. The bit-line layers 91 are formed in a stripe pattern extending in the column direction at a certain pitch in the row direction. The bit-line layer 91 is formed in contact with the top surface of the drain-side columnar semiconductor layer 84.

The bit-line layers 91 comprise polysilicon (p-Si). Each bit-line layer 91 functions as a bit line BLa.

(Erase Operation of Non-Volatile Semiconductor Storage Device in Third Embodiment)

Figure 23:
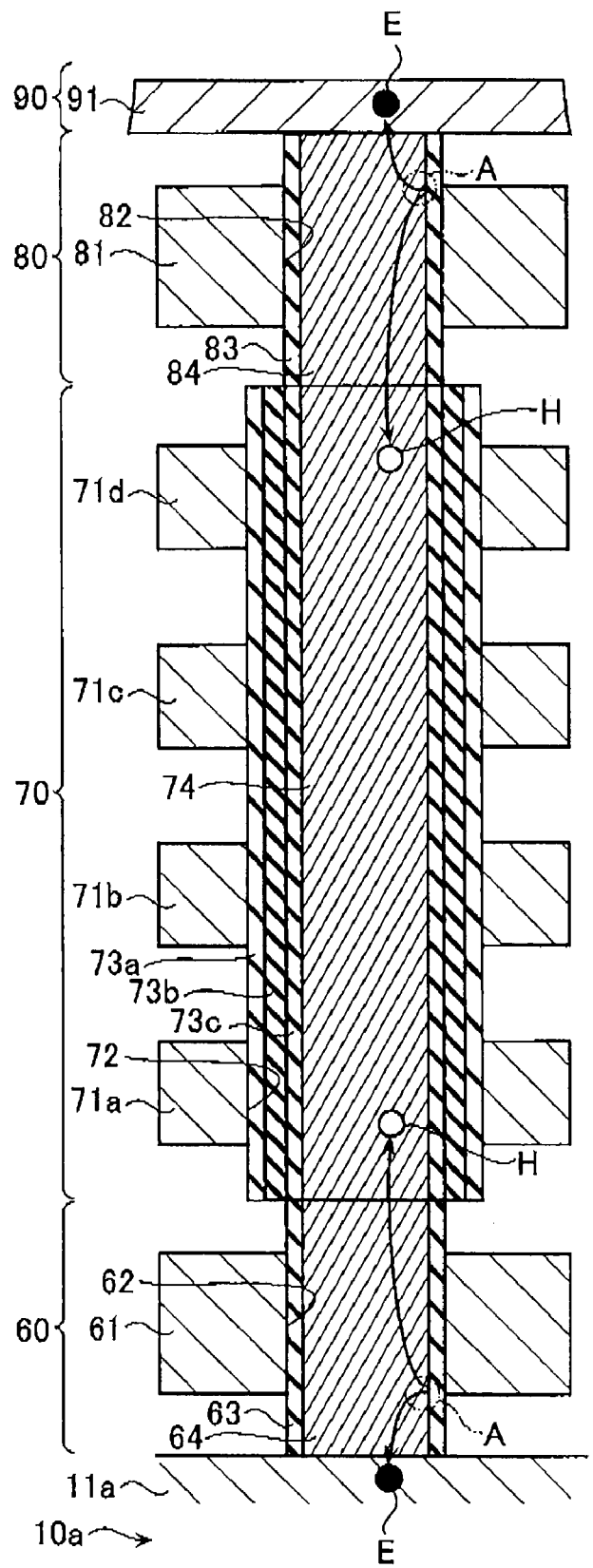
FIG. 23 is a diagram for illustrating the GIDL current according to the third embodiment.

Referring now to FIG. 23, an erase operation of the non-volatile semiconductor storage device according to the third embodiment will be described below.

In erase operation according to the third embodiment, as indicated by a label "A" in FIG. 23, a GIDL current is caused by creating a higher electric field at the end of a source-side conductive layer 61 (a source-side selection gate line SGSa) on the diffusion layer 11*a* (a source line SLa) side. A GIDL current is also caused by creating a higher electric field at the end of a drain-side conductive layer 81 (a drain-side selection gate line SGDa) on the bit-line layer 91 (a bit line BLa) side. The erase operation in the third embodiment is otherwise the same as that described in the first embodiment.

(Advantages of Non-Volatile Semiconductor Storage Device in Third Embodiment)

The non-volatile semiconductor storage device according to the third embodiment has the same features and advantages as the first embodiment.

Fourth Embodiment

Configuration of Non-Volatile Semiconductor Storage Device in Fourth Embodiment

Figure 24:
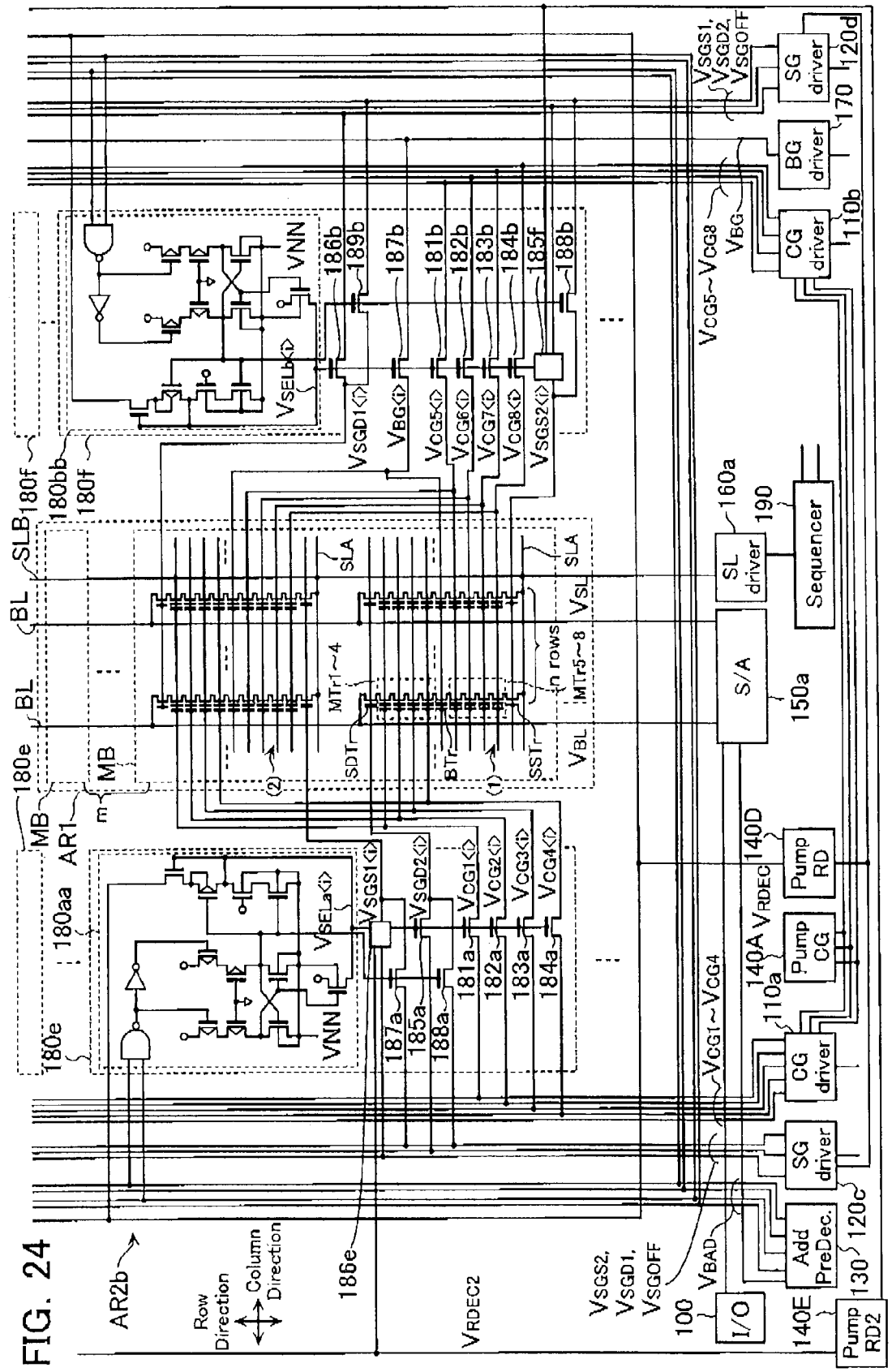
FIG. 24 is a circuit diagram of a non-volatile semiconductor storage device according to a fourth embodiment.

Referring now to FIG. 24, a configuration of a non-volatile semiconductor storage device according to a fourth embodiment will be described below. FIG. 24 is a circuit diagram of the non-volatile semiconductor storage device in the fourth embodiment. Note that the same reference numerals represent the same components as the first to third embodiments, and description thereof will be omitted in the fourth embodiment.

As illustrated in FIG. 24, the non-volatile semiconductor storage device in the fourth embodiment has a control circuit AR2*b* that is different from the first to third embodiments.

The control circuit AR2*b* has selection-gate-line driving circuits 120*c* and 120*d*, a boost circuit 140D, a source-line driving circuit 160*a*, and first and second row decoder circuits 180*e* and 180*f*, instead of the selection-gate-line driving circuits 120*a* and 120*b*, the boost circuit 140C, the source-line driving circuit 160, and the first and second row decoder circuits 180*a* and 180*b* in the first to third embodiments. The control circuit AR2*b* also has a boost circuit 140E in addition to the configuration of the second embodiment. In this respect, the control circuit AR2*b* according to the fourth embodiment is different from the first to third embodiments.

Figure 25:
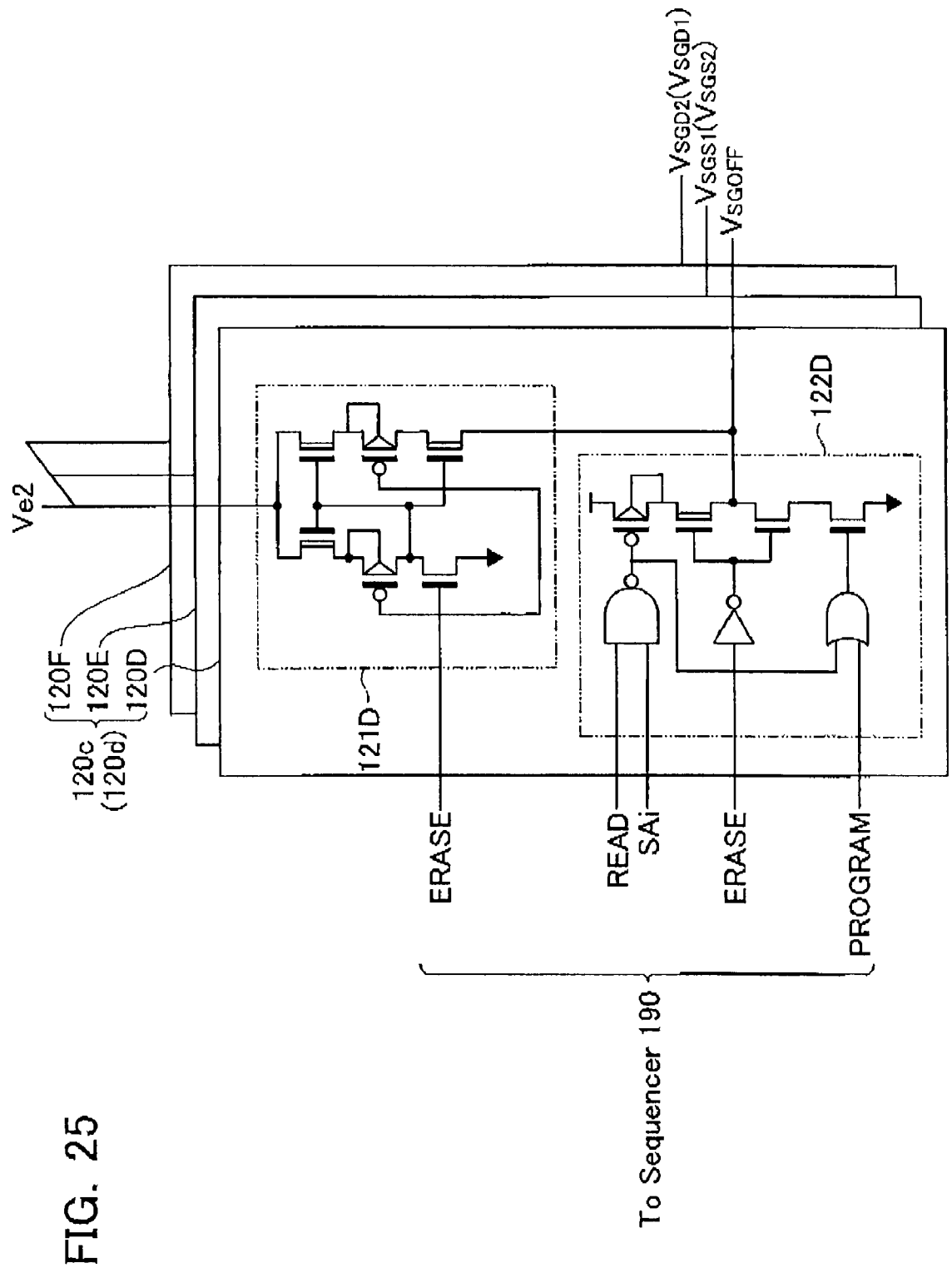
FIG. 25 is a circuit diagram of a selection-gate-line driving circuit 120c (120d) according to the fourth embodiment.

As illustrated in FIG. 25, each selection-gate-line driving circuit 120c (120d) has first to third selection-gate-line driving circuits 120D to 120F. The first selection-gate-line driving circuit 120D outputs a signal $V_{SGOFF}$. The second selection-gate-line driving circuit 120E outputs a signal $V_{SGS1}$ ($V_{SGS2}$). The third selection-gate-line driving circuit 120F outputs a signal $V_{SGD2}$ ($V_{SGD1}$). The signals $V_{SGOFF}$, $V_{SGS1}$ ($V_{SGS2}$), and $V_{SGD2}$ ($V_{SGD1}$) have the same potentials as the ground voltage Vss, the power supply voltage Vdd, and the signal Ve2, respectively.

As illustrated in FIG. 25, each first selection-gate-line driving circuit 120D has a first circuit 121D and a second circuit 122D.

As illustrated in FIG. 25, the output terminal of the first circuit 121D is connected to the output terminal of the second circuit 122D. The first circuit 121D receives a signal Ve2 from the boost circuit 140D and a signal ERASE from the sequencer 190. If the signal ERASE is in a "High" state, then the first circuit 121D outputs the received signal Ve2. The signal ERASE is set in a "High" state when performing erase operation.

The second circuit 122D receives signals READ, SAi, ERASE, and PROGRAM from the sequencer 190. The signal READ is set in a "High" state when performing read operation. The signal PROGRAM is set in a "High" state when performing write operation.

The second circuit 122D outputs a signal at the power supply voltage Vdd or the ground voltage Vss based on the received signal. If the signals READ, SAi, and ERASE are in "High" states, then the second circuit 122D outputs a signal at the power supply voltage Vdd. If the signals PROGRAM and ERASE are in a "Low" state, and if the signals READ and SAi are in "High" states, then the second circuit 1220 outputs a signal at the ground voltage Vss.

Figure 26A:
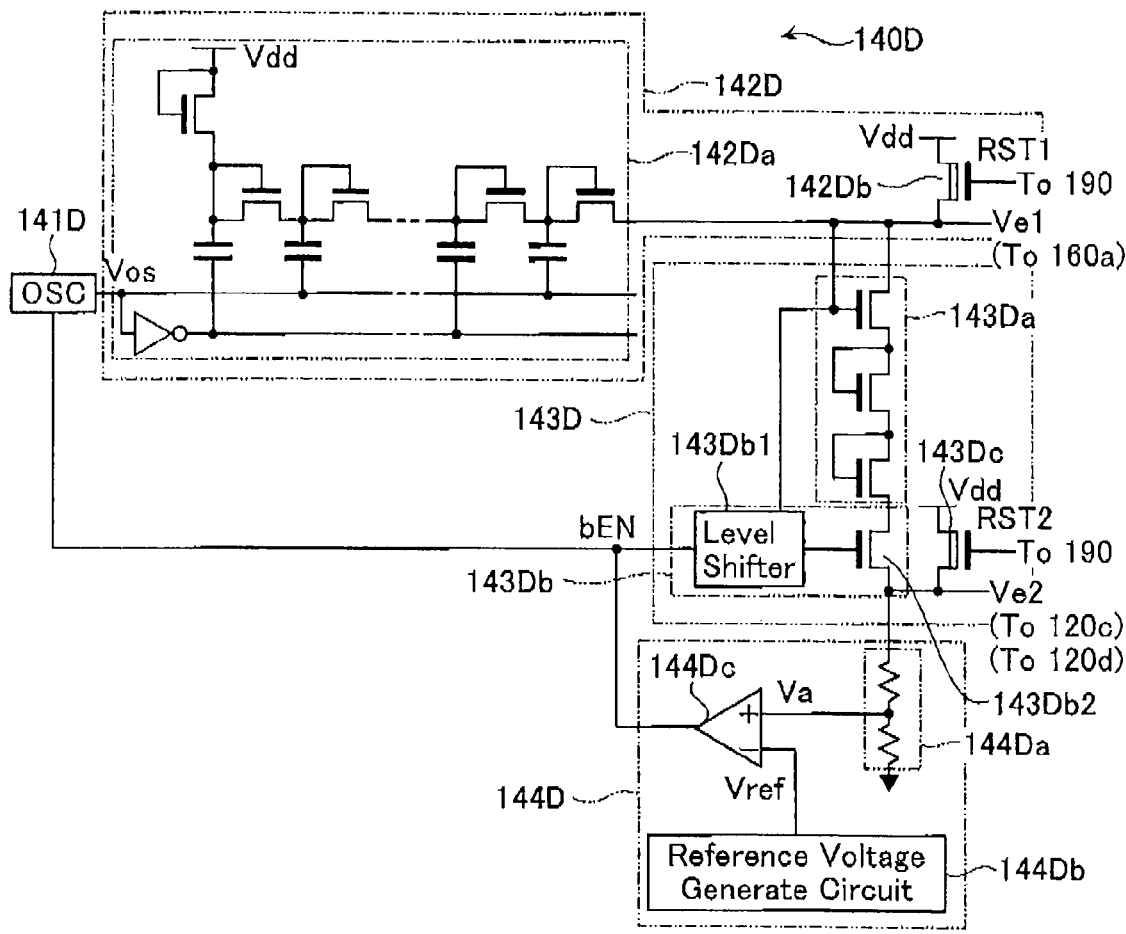
FIG. 26A is a circuit diagram of a boost circuit 140D according to the fourth embodiment.

As illustrated in FIG. 26A, each boost circuit 140D has an oscillation circuit 141D, a first signal generation circuit 142D, a second signal generation circuit 143D, and a third signal generation circuit 144D.

Figure 26B:
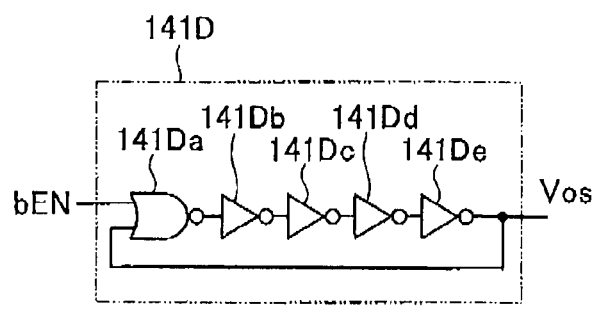
FIG. 26B is a circuit diagram of an oscillation circuit 141D according to the fourth embodiment.

As illustrated in FIG. 26B, the oscillation circuit 141D is a ring oscillator including a NOR circuit 141Da and inverter circuits 141Db to 141De. The oscillation circuit 141D outputs an oscillation signal Vos based on a signal bEN from the third signal generation circuit 144D. The oscillation circuit 141D outputs an oscillation signal Vos only when the signal bEN is in a "Low" state, and does not output an oscillation signal Vos when the signal bEN is in a "High" state.

As illustrated in FIG. 26A, the first signal generation circuit 142D boosts the voltage of the signal Ve1 based on the oscillation signal Vos from the oscillation circuit 141D. In addition, based on the signal bEN (differential signal), the first signal generation circuit 142D switches between an operational state and a stop state depending on the oscillation signal Vos from the oscillation circuit 141D. The voltage of the signal Ve1 is set at the ground voltage Vss or the power supply voltage Vdd. In addition, the voltage of the signal Ve1 is boosted from the power supply voltage Vdd to an erase voltage Vera1. The signal Ve1 is output to the source-line driving circuit 160a.

As illustrated in FIG. 26A, the first signal generation circuit 142D has a charge pump circuit 142Da and a transistor 142Db. The charge pump circuit 142Da boosts the signal Ve1 from the power supply voltage Vdd to the erase voltage Vera1 based on the oscillation signal Vos. The transistor 142Db has one end to which the power supply voltage Vdd is supplied. In addition, the transistor 142Db has a gate to which a signal RST1 is input from the sequencer 190, and the other end that is connected to the output terminal of the charge pump circuit 142Da. If the signal RST1 is in a "High" state, then the transistor 142Db turns to an "ON" state. As a result, the signal Ve1 is fixed at the power supply voltage Vdd.

As illustrated in FIG. 26A, the second signal generation circuit 143D generates a signal Ve2 based on the signal Ve1 from the first signal generation circuit 142D. In addition, the second signal generation circuit 143D switches between an operational state and a non-operational state depending on the signal bEN from the third signal generation circuit 144D. The voltage of the signal Ve2 is set at the ground voltage Vss or the power supply voltage Vdd. In addition, the voltage of the signal Ve2 is boosted from the power supply voltage Vdd to a voltage Vera2 (Vera2<Vera1) after a certain delay time has elapsed since the signal Ve1 is boosted. The signal Ve2 is boosted depending upon the boost of the signal Ve1. The signal Ve2 is output to the selection-gate-line driving circuits 120c and 120d.

As illustrated in FIG. 26A, the second signal generation circuit 143D has a delay circuit 143Da, a switch circuit 143Db, and a transistor 143Dc.

The delay circuit 143Da delays the signal Ve1 by a certain period of time and reduces the voltage of the signal Ve1 by a certain amount, thereby generating a signal. The switch circuit 143Db controls whether or not to output the signal from the delay circuit 143Da as a signal Ve2, based on the output signal bEN of the third signal generation circuit 144D.

Figure 26C:
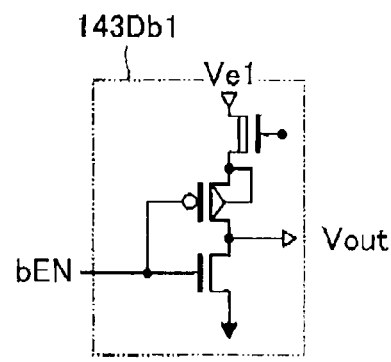
FIG. 26C is a circuit diagram of a level shifter 143Db1 according to the fourth embodiment.

As illustrated in FIG. 26A, the switch circuit 143Db has a level shifter circuit 143Db1 and a transistor 143Db2. As illustrated in FIG. 26C, the level shifter circuit 143Db1 outputs the received signal Ve1 when the signal bEN is in a "Low" state. The transistor 143Db2 has one end connected to the output terminal of the delay circuit 143Da. The transistor 143Db2 has a gate connected to the output terminal of the level shifter circuit 143Db1. The transistor 143Db2 turns to an "ON" state when the signal from the level shifter circuit 143Db1 is in a "High" state.

As illustrated in FIG. 26A, the transistor 143Dc has a source connected to the output terminal of the switch circuit 143Db (the source of the transistor 143Db2). The transistor 143Dc has a drain to which the power supply voltage Vdd is applied, and a gate that receives a signal RST2 input from the sequencer 190. If the signal RST2 is in a "High" state, then the transistor 143Dc turns to an "ON" state. As a result, the voltage of the output terminal of the switch circuit 143Db is fixed at the power supply voltage Vdd.

As illustrated in FIG. 26A, the third signal generation circuit 144D outputs a signal bEN. The third signal generation circuit 144D generates a signal Va based on the signal Ve2. The signal Va has a voltage resulting from reducing the voltage of the signal Ve2 by a certain amount. In addition, the third signal generation circuit 144D compares the voltage of the signal Va with a reference potential (reference voltage) Vref to output a signal bEN. The signal Va has a certain relation to the signal Ve1.

As illustrated in FIG. 26A, the third signal generation circuit 1440 has a voltage drop circuit 144Da, a reference potential generation circuit 144Db, and a differential amplifier circuit 144Dc.

As illustrated in FIG. 26A, the voltage drop circuit 144Da generates a signal Va at a voltage resulting from reducing the voltage of the signal Ve2 by a certain amount. As illustrated in FIG. 26A, the input terminal of the voltage drop circuit 1440a is connected to the output terminal of the switch circuit 143Db (the source of the transistor 143Db2) in the second signal generation circuit 143D. The output terminal of the voltage drop circuit 144Da is connected to one input terminal of the differential amplifier circuit 144Dc.

As illustrated in FIG. 26A, the reference potential generation circuit 144Db generates a reference potential Vref to be input to the other terminal of the differential amplifier circuit 144Dc.

As illustrated in FIG. 26A, the differential amplifier circuit 144Dc compares the signal Va with the signal Vref to output a signal bEN.

The boost circuit 140E generates a signal Vhh resulting from boosting the power supply voltage Vdd to a certain voltage. As illustrated in FIG. 24, the boost circuit 140E inputs the signal Vhh to the first and second row decoder circuits 180e and 180f.

Figure 27:
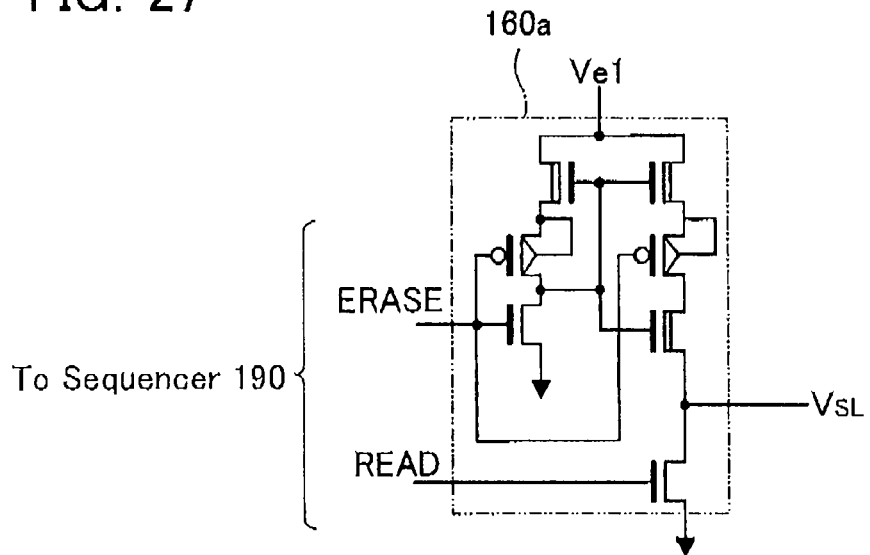
FIG. 27 is a circuit diagram of a source-line driving circuit 160a according to the fourth embodiment.

As illustrated in FIG. 27, the source-line driving circuit 160a receives the signal Ve1 input from the boost circuit 140D, and controls a signal $V_{SL}$ to be provided to the source line SL, based on the signals ERASE and READ from the sequencer 190. The source-line driving circuit 160b sets the signal $V_{SL}$ at the ground voltage Vss if the signal READ is in a "High" state. In addition, the source-line driving circuit 160b provides a signal Ve1 to the source line SL as a signal $V_{SL}$ if the signal ERASE is in a "High" state.

As illustrated in FIG. 24, the first and second row decoder circuits 180e and 180f has transfer circuits 186e and 185f, respectively, instead of the first transfer transistors 186a and 185b according to the first embodiment.

Figure 28A:
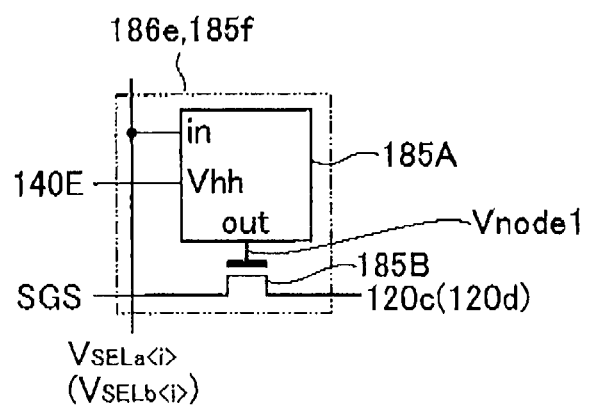
FIG. 28A is a circuit diagram of transfer circuits 186e and 185f according to the fourth embodiment.
Figure 28B:
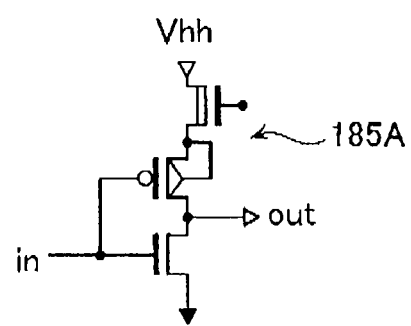
FIG. 28B is a circuit diagram of the transfer circuits 186e and 185f according to the fourth embodiment.

As illustrated in FIG. 28A, each of the transfer circuits 186e and 185f has a voltage conversion circuit 185A and a transistor 185B. As illustrated in FIGS. 28A and 28B, the voltage conversion circuit 185A receives signals $V_{REDC2}$ and $V_{SELa<i>}$ ($V_{SELb<i>}$) from the boost circuit 140D. In addition, the transfer circuits 186e and 135f receive a signal Vhh from the boost circuit 140E. The voltage conversion circuit 185A outputs a signal Vnode1 based on the signal $V_{SELa<i>}$ ($V_{SELb<i>}$) and controls on/off of the transistor 185B.

As illustrated in FIG. 28A, the transistor 185B has one end connected to a selection-gate-line driving circuit 120c (120d) and the other end to a source-side selection gate line SGS.

(Overview of Erase Operation of Non-Volatile Semiconductor Storage Device in Fourth Embodiment)

Figure 29:
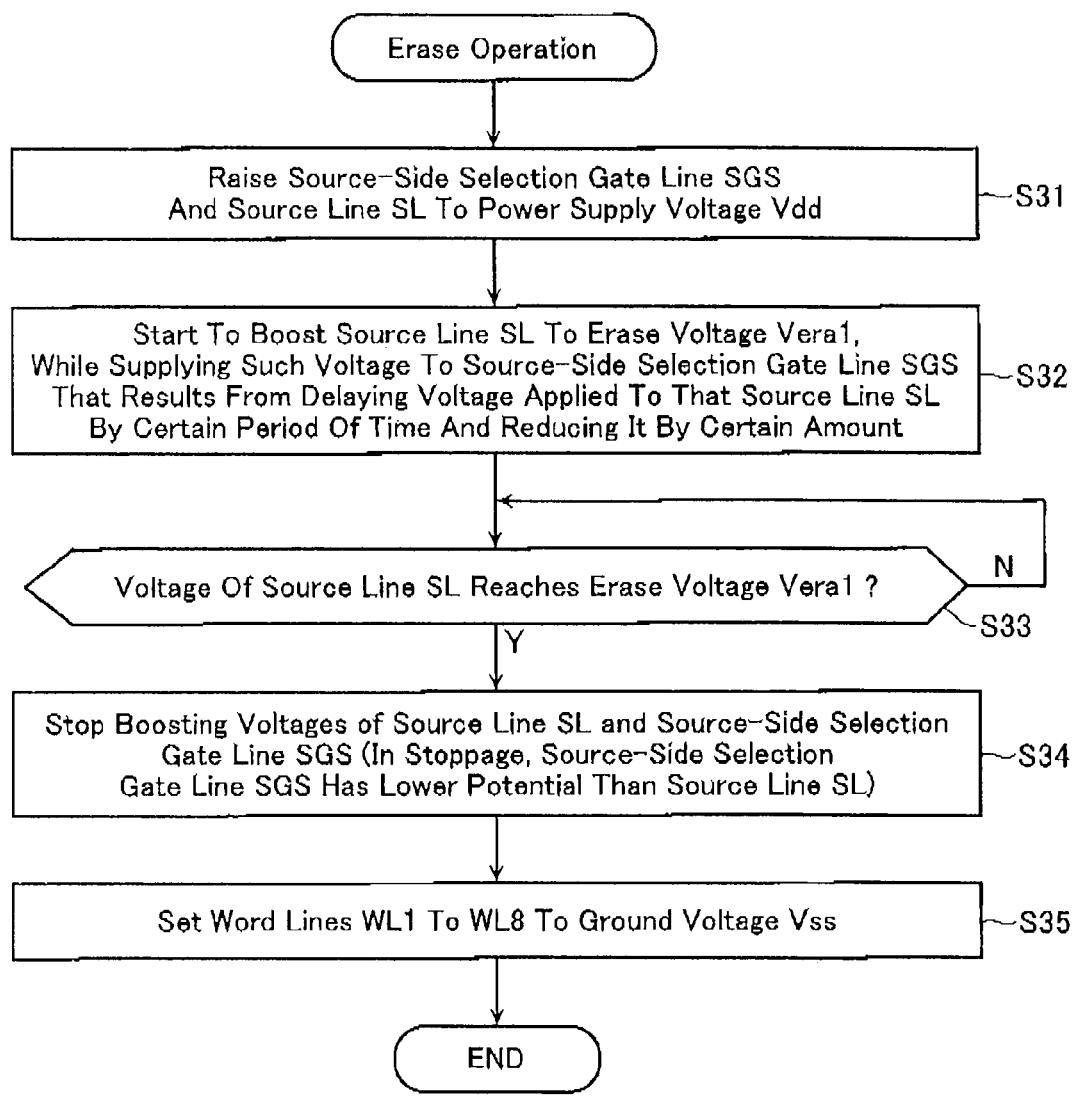
FIG. 29 is a flowchart illustrating an erase operation according to the fourth embodiment.
Figure 30:
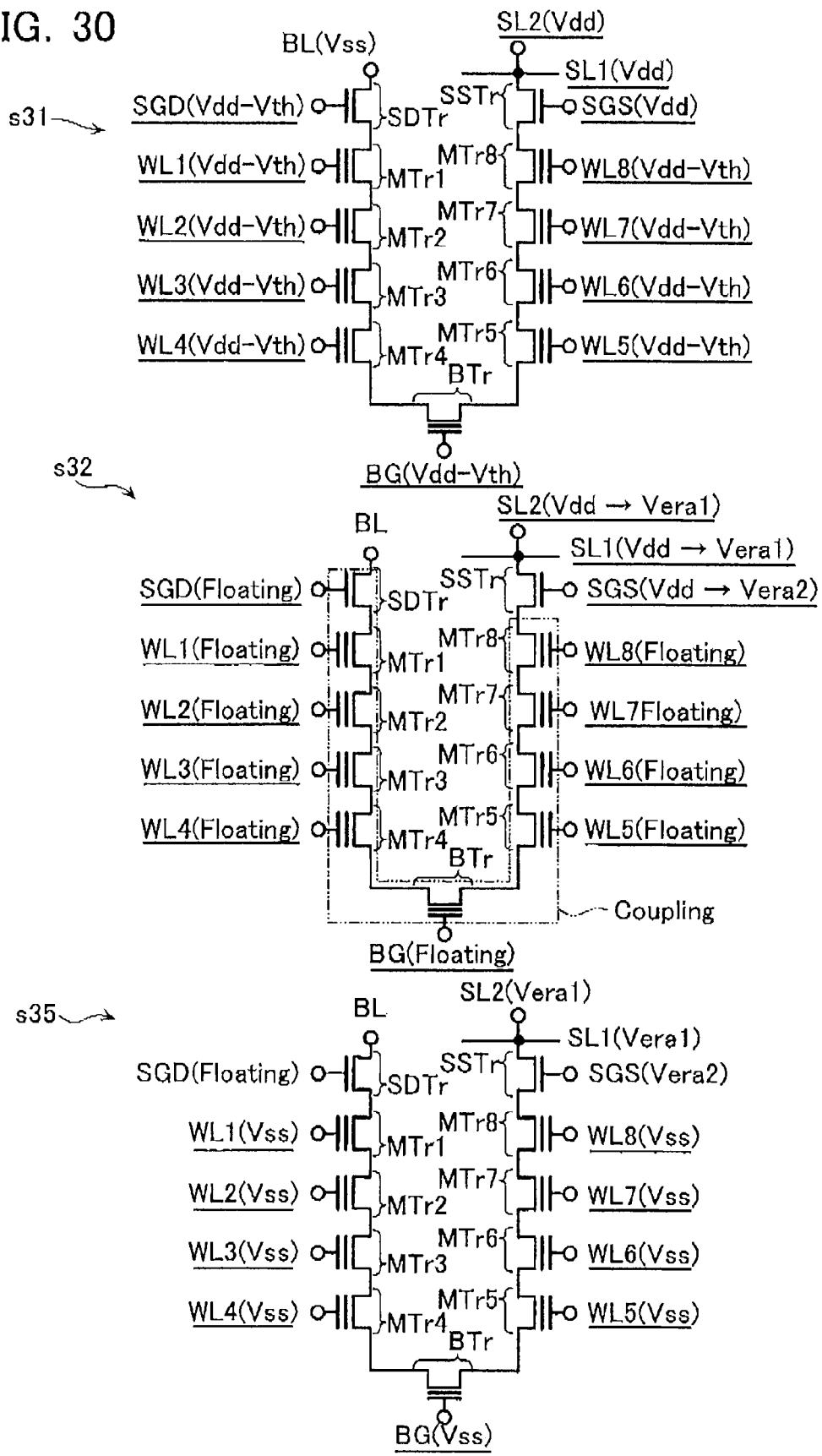
FIG. 30 is a schematic diagram illustrating the erase operation according to the fourth embodiment.

Referring now to FIGS. 29 and 30, an erase operation of the non-volatile semiconductor storage device according to the fourth embodiment will be outlined below. FIG. 29 is a flowchart illustrating an erase operation of the non-volatile semiconductor storage device in the fourth embodiment. FIG. 30 schematically illustrates the erase operation.

Firstly, as indicated by a label "s31" in FIG. 30, the control circuit AR2b raises the source-side selection gate line SGS and the source line SL to a power supply voltage Vdd in a selected memory block MB (step S31). Note that the word lines WL1 to WL8 and the back-gate line BG are raised to a certain voltage Vdd-Vth.

Subsequently, as indicated by a label "s32" in FIG. 30, the control circuit AR2b starts boosting the source line SL to the erase voltage Vera1 in the selected memory block MB, while supplying such a voltage to the source-side selection gate line SGS that results from delaying the voltage applied to that source line SL by a certain period of time and reducing it by a certain amount (which is the start of the voltage boost to an erase voltage Vera2) (step S32). That is, the control circuit AR2b starts boosting the source-side selection gate line SGS in time with the source line SL being boosted. This causes a GIDL current. In addition, the word lines WL1 to WL8, the back-gate line BG, and the drain-side selection gate line SGD are set in floating states.

Then, the control circuit AR2b determines whether or not the voltage of the source line SL reaches the erase voltage Vera1 in the selected memory block MB (step S33). At this point, if it is determined that the voltage of the source line SL reaches the erase voltage Vera1 ("Y" at step S33), then the control circuit AR2b stops boosting that voltage (step S34). At step S34, the control circuit AR2b also stops boosting the source-side selection gate line SGS. Note that at the point of the stoppage, the source-side selection gate line SGS has a lower potential than the source line SL.

After execution of the operation at step S34, as indicated by a label "s35" in FIG. 30, the control circuit AR2b sets the word lines WL1 to WL8 and the back-gate line BG at the ground voltage Vss (step S35), and feeds the holes H caused by the GIDL currents into the gates of the memory transistors MTr1 to MTr8. In this way, data is erased.

(Specific Erase Operation of Non-Volatile Semiconductor Storage Device in Fourth Embodiment)

Figure 31A:
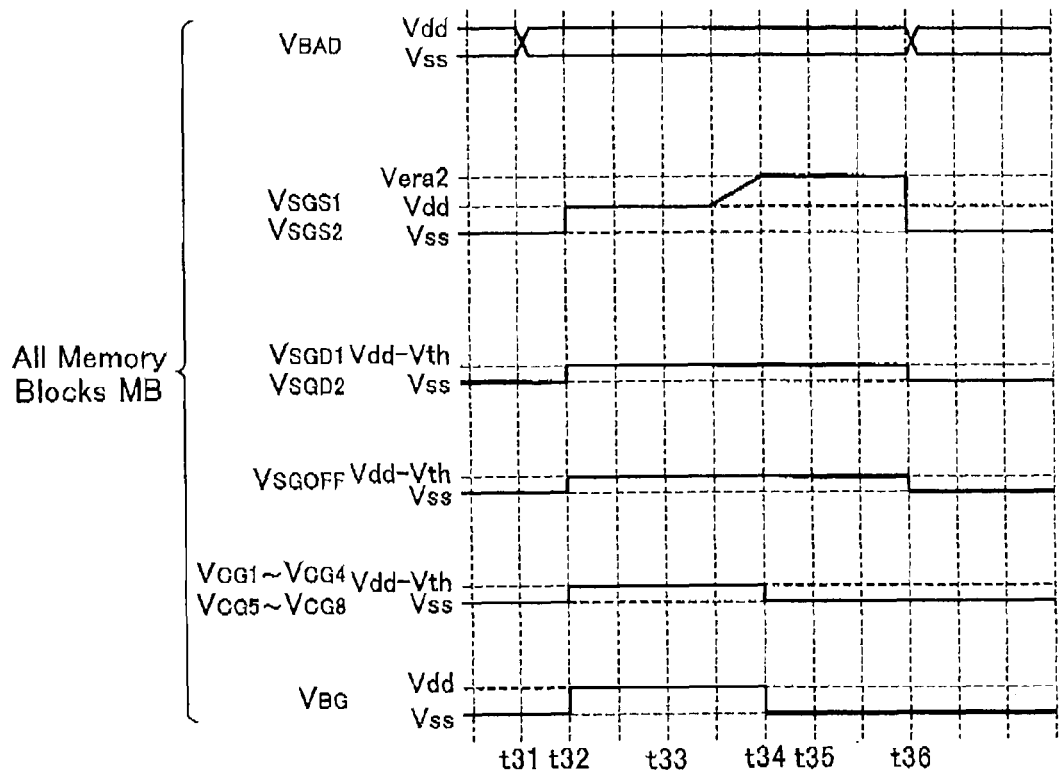
FIG. 31A is a timing chart illustrating the erase operation according to the fourth embodiment.
Figure 31A:
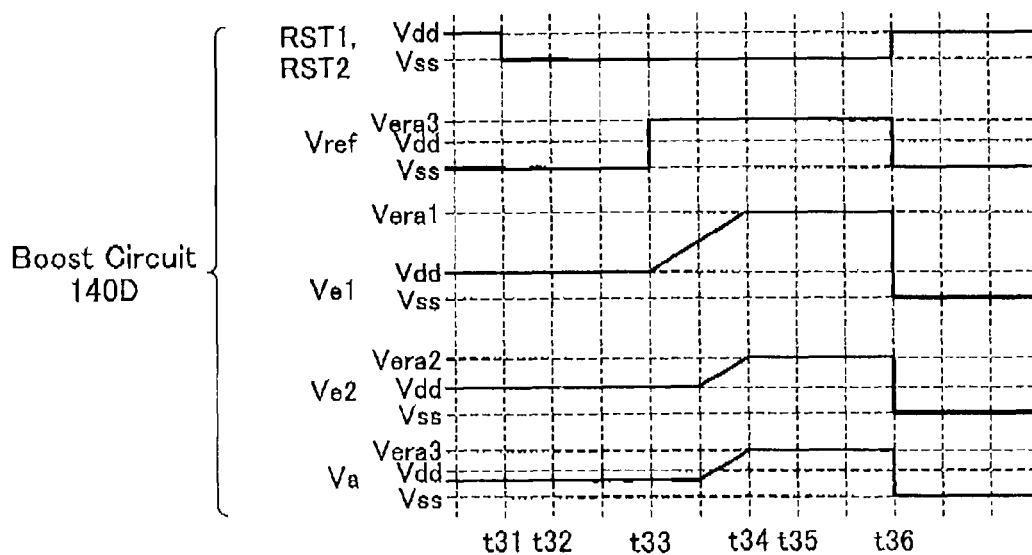
Figure 31B:
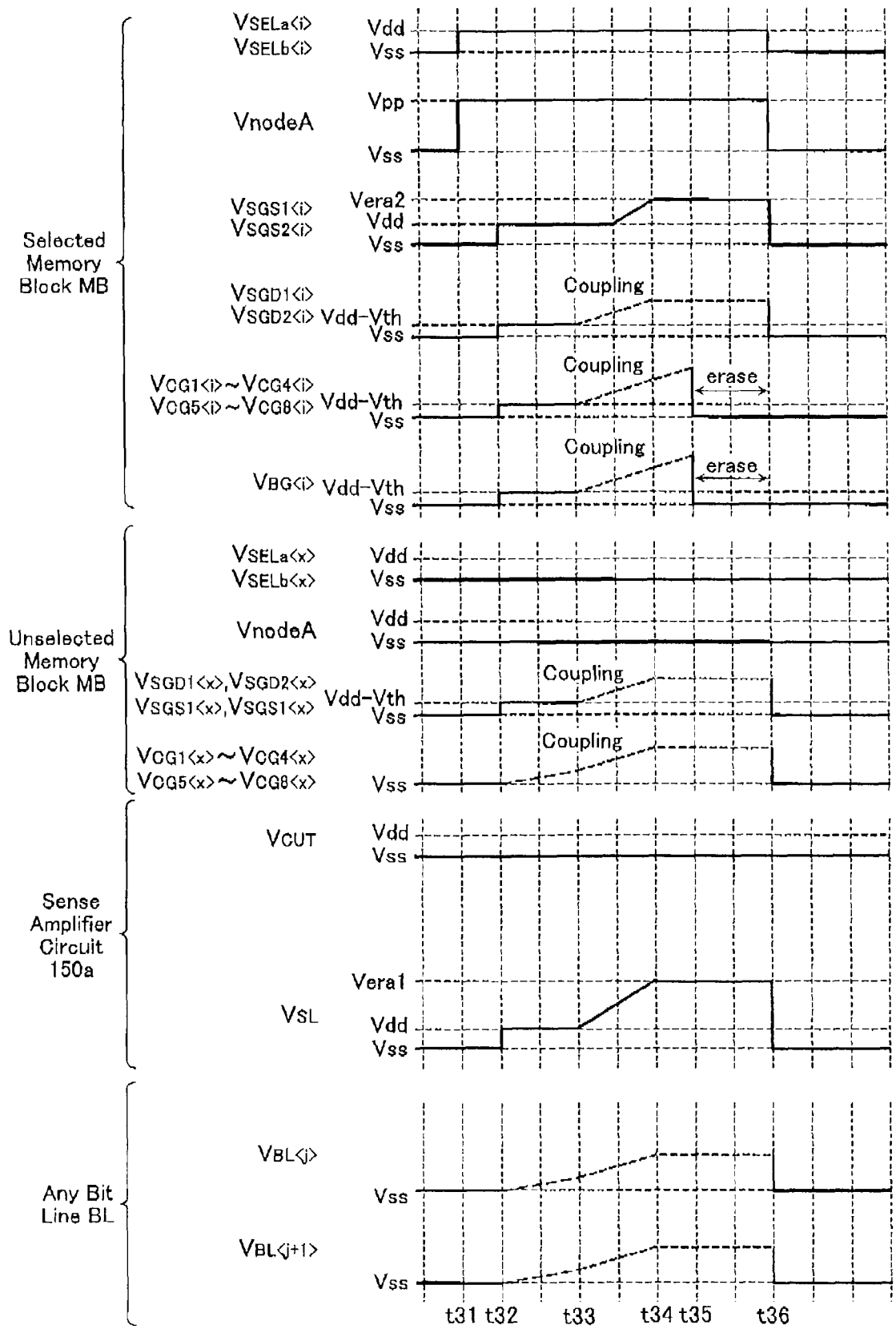
FIG. 31B is a timing chart illustrating the erase operation according to the fourth embodiment.

Referring now to FIGS. 31A and 31B, a specific erase operation of the non-volatile semiconductor storage device according to the fourth embodiment will be described below. FIGS. 31A and 31B are timing charts illustrating an erase operation.

Firstly, as illustrated in FIG. 31A, at time t31, a signal $V_{BAD}$ is inverted.

As illustrated in FIG. 31A, due to the change of the signal $V_{BAD}$, at time t31, signals RST1 and RST2 fall from the power supply voltage Vdd to the ground voltage Vss. That is, the transistors 142Db and 143Dc in the boost circuit 140D are set in OFF states and the signals Ve1 and Ve2 output from the boost circuit 140D are set in floating states.

In addition, as illustrated in FIG. 31B, due to the change of the signal $V_{BAD}$, at time t31, the signals $V_{SELa<i>}$ and $V_{SELb<i>}$ rise from the ground voltage Vss to the power supply voltage Vdd in the selected memory block MB. That is, the first transfer transistors 181a to 185a (181b to 184b, 186b, and 187b) are set in ON states. On the other hand, the ground voltage Vss is applied to the gates of the second transfer transistors 187a and 188a (188b and 189b). This allows the second transfer transistors 187a and 188a (188b and 189b) to be set in OFF states thereby. Through this operation, in the selected memory block MB, the word lines WL1 to WL4 and WL5 to WL8 are connected to the word-line driving circuits 110a and 110b via the first transfer transistors 181a to 184a and 181b to 184b, respectively. In addition, the drain-side selection gate line SGD is connected to the selection-gate-line driving circuits 120c and 120d via the first transfer transistors 185a and 186b, respectively. Furthermore, the back-gate line BG is connected to the back-gate-line driving circuit 170 via the first transfer transistor 187b.

In addition, as illustrated in FIG. 31B, due to the change of the signal $V_{BAD}$, at time t31, the signals VnodeA of the transfer transistors 186e and 185f rise to the voltage Vpp in the selected memory block MB. That is, in the selected memory block MB, the transfer transistors 186e and 185f connect the source-side selection gate line SGS to the selection-gate-line driving circuits 120c and 120d.

On the other hand, as illustrated in FIG. 31B, due to the change of the signal $V_{BAD}$, at time t31, the signals $V_{SELa<x>}$ and $V_{SELb<x>}$ are maintained at the voltage Vss in the unselected memory blocks MB. That is, the first transfer transistors 181a to 186a (181b to 187b) are maintained in the OFF states. On the other hand, the voltage VDD is applied to the gates of the second transfer transistors 187a and 188a (188b and 189b). This allows the first transfer transistors 187a and 188a (188b and 189b) to be set in ON states. Through this operation, the word lines WL1 to WL4 and WL5 to WL8 are set in floating states in the unselected memory blocks MB. In addition, the source-side selection gate line SGS and the drain-side selection gate line SGD are connected to the selection-gate-line driving circuits 120c and 120d via the second transfer transistors 188a, 187a, 188b, and 189b, respectively. Furthermore, the back-gate line BG is set in a floating state.

In addition, as illustrated in FIG. 31B, at time t31, the signals VnodeA of the transfer transistors 186e and 185f are maintained at the ground voltage Vss in the unselected memory blocks MB. That is, in the unselected memory blocks MB, the transfer transistors 186e and 185f keep the source-side selection gate line SGS unconnected to the selection-gate-line driving circuits 120c and 120d.

Then, as illustrated in FIG. 31A, at time t32, the signals $V_{SGS1}$ and $V_{SGS2}$ are raised from the ground voltage Vss to the power supply voltage Vdd. In addition, at time t32, the signals $V_{SGD1}$, $V_{SGD2}$, $V_{SGOFF}$, $V_{CG1}$ to $V_{CG8}$ and $V_{BG}$ are raised from the ground voltage Vss to the certain voltage Vdd-Vth.

As illustrated in FIG. 31B, at time t32, due to the change of the signals $V_{SGS1}$ and $V_{SGS2}$, the signals $V_{SGS1<i>}$ and $V_{SGS2<i>}$ are raised to the power supply voltage Vdd in the selected memory block MB. In addition, at time t32, due to the change of the signals $V_{SGD1}$, $V_{SGD2}$, $V_{CG1}$ to $V_{GG8}$, and $V_{BG}$, the signals $V_{SGD1<i>}$, $V_{SGD2<i>}$, $V_{CG1<i>}$ to $V_{CG8<i>}$, and $V_{BG<i>}$ are raised to the certain voltage Vdd-Vth in the selected memory block MB.

In addition, as illustrated in FIG. 31B, at time t32, the signal $V_{SL}$ is raised to the power supply voltage Vdd at the source-line driving circuit 160.

Subsequently, as illustrated in FIG. 31B, at time t33, the signal Vref is raised to a voltage Vera3 at the boost circuit 140D. Accordingly, at time t33, the oscillation circuit 141D begins its operation and the first signal generation circuit 142D starts boosting the signal Ve1. Then, after a certain period of time has elapsed since time t33, the second signal generation circuit 143D starts boosting the signal Ve2.

In addition, as illustrated in FIG. 31B, at time t33, in response to the operation of the boost circuit 140D mentioned above, the voltages of the signals $V_{SGS1}$ and $V_{SGS2}$ begin to rise according to the signal Ve2. As a result, the voltages of the signals $V_{SGS1<i>}$ and $V_{SGS2<i>}$ begin to rise in the selected memory block MB. The voltage of the signal $V_{SL}$ also begins to rise according to the signal Ve1.

Subsequently, as illustrated in FIG. 31A, at time t34, it is determined by the boost circuit 140D based on the signal bEN that the signal Va is boosted to the voltage Vera3 (i.e., the signal Ve1 is boosted to a certain voltage). Then, the boost of the signals Ve1 and Ve2 is stopped and the signals Ve1 and Ve2 are set at the erase voltages Vera1 and Vera2.

In addition, as illustrated in FIG. 31B, at time t34, in response to the operation of the boost circuit 140D mentioned above, the boost of the signals $V_{SGS1}$ and $V_{SGS2}$ is stopped and the signals $V_{SGS1}$ and $V_{SGS2}$ are set at the erase voltage Vera2. As a result, in the selected memory block MB, the boost of the signals $V_{SGS1<i>}$ and $V_{SGS2<i>}$ is stopped and the signals $V_{SGS1<i>}$ and $V_{SGS2<i>}$ are set at the erase voltage Vera2. The boost of the signal $V_{SL}$ is also stopped and the signal $V_{SL}$ is set at the erase voltage Vera1.

Then, as illustrated in FIG. 31A, at time t35, the signals $V_{CG1}$ to $V_{CG8}$ and $V_{BG}$ are set at the ground voltage Vss. Through the control at time t35, the holes H caused by the GIDL currents are fed into the gates of the memory transistors MTr1 to MTr8, after which execution of the erase operation begins.

Then, as illustrated in FIG. 31A and FIG. 318, the erase operation ends at time t36.

(Advantages of Non-Volatile Semiconductor Storage Device in Fourth Embodiment)

Advantages of the non-volatile semiconductor storage device according to the fourth embodiment will now be described below. As described above, the non-volatile semiconductor storage device in the fourth embodiment has a boost circuit 140D. The boost circuit 140D generates signals Ve1 and Ve2. The signal Ve2 is boosted after a certain period of time has elapsed since the signal Ve1 is boosted, while maintaining a certain potential difference from the signal Ve1. In addition, the signal Ve1 is supplied to the source line SL and the signal Ve2 is supplied to the source-side selection gate line SGS. Using the signals Ve1 and Ve2 of the boost circuit 140D, the non-volatile semiconductor storage device in the fourth embodiment may achieve efficient data erase operation with GIDL currents, as in the first to third embodiments.

It should also be noted that unlike the first to third embodiments described above, the non-volatile semiconductor storage device in the fourth embodiment does not use the coupling ratio between the body of a memory string MS and a source line SL to generate a GIDL current. That is, the non-volatile semiconductor storage device in the fourth embodiment directly specifies the potentials of source-side selection transistors SSTr and source lines SL to generate a GIDL current. This allows the non-volatile semiconductor storage device in the fourth embodiment to perform an erase operation, independent of device parameters, such as coupling ratio or wiring capacitance. In addition, the non-volatile semiconductor storage device in the fourth embodiment may mitigate the stress on the gates of the source-side selection transistors SSTr as compared with the first to third embodiments.

OTHER EMBODIMENTS

While embodiments of the non-volatile semiconductor storage device have been described, the present invention is not intended to be limited to the disclosed embodiments, and various other changes, additions, replacements or the like may be made thereto without departing from the spirit of the invention.

What is claimed is:

1. A non-volatile semiconductor storage device comprising:
   a memory string including a plurality of memory cells connected in series;
   a first selection transistor having one end connected to one end of a respective one of the memory string;
   a first wiring having one end connected to the other end of the first selection transistor;
   a second wiring connected to a gate of the first selection transistor; and
   a control circuit configured to perform erase operation to erase data from the memory cells,
   the memory string comprising:
      a first semiconductor layer having a columnar portion extending in a vertical direction to a substrate;
      an electric charge storage layer formed to surround the first semiconductor layer; and
      a first conductive layer surrounding the electric charge storage layer and extending parallel to the substrate,
   the first selection transistor comprising:
      a second semiconductor layer in contact with a top or bottom surface of the columnar portion and extending in the vertical direction to the substrate;
      a first gate insulation layer formed to surround the second semiconductor layer; and
      a second conductive layer surrounding the first gate insulation layer and extending parallel to the substrate,
   the control circuit being configured to boost voltages of the second wiring and the first wiring in the erase operation, while keeping the voltage of the first wiring greater than the voltage of the second wiring by a certain potential difference, the certain potential difference being a potential difference that erases data from the memory cells, in the erase operation, the control circuit raising the first wiring to a first voltage and the second wiring to a second voltage so that the certain potential difference is maintained therebetween, and then starting boosting the first wiring from the first voltage while setting the second wiring in a floating state.

2. A non-volatile semiconductor storage device comprising:

a memory string including a plurality of memory cells connected in series;

a first selection transistor having one end connected to one end of a respective one of the memory string;

a first wiring having one end connected to the other end of the first selection transistor;

a second wiring connected to a gate of the first selection transistor; and a control circuit configured to perform erase operation to erase data from the memory cells, the memory string comprising:

a first semiconductor layer having a columnar portion extending in a vertical direction to a substrate;

an electric charge storage layer formed to surround the first semiconductor layer; and a first conductive layer surrounding the electric charge storage layer and extending parallel to the substrate, the first selection transistor comprising:

a second semiconductor layer in contact with a top or bottom surface of the columnar portion and extending in the vertical direction to the substrate;

a first gate insulation layer formed to surround the second semiconductor layer; and a second conductive layer surrounding the first gate insulation layer and extending parallel to the substrate, the control circuit being configured to boost voltages of the second wiring and the first wiring in the erase operation, while keeping the voltage of the first wiring greater than the voltage of the second wiring by a certain potential difference, the certain potential difference being a potential difference that erases data from the memory cells, the control circuit comprising:

a first voltage generation circuit configured to supply a first voltage to be boosted to the first wiring;

a second voltage generation circuit configured to supply a second voltage to the second wiring, the second voltage resulting from delaying the first voltage by a certain period of time and reducing the first voltage by the certain potential difference; and a third voltage generation circuit configured to compare a third voltage with a reference voltage to output a differential signal, the third voltage having a certain relation to the first voltage, the first voltage generation circuit switches between an operational state and a stop state based on the differential signal, and the second voltage generation circuit switches between an operational state and a stop state based on the differential signal.

3. The non-volatile semiconductor storage device according to claim 2, wherein the control circuit comprises an oscillation circuit configured to output an oscillation signal based on the differential signal, and the first voltage generation circuit comprises a boost circuit configured to boost a certain voltage to the first voltage based on the oscillation signal.

4. The non-volatile semiconductor storage device according to claim 2, wherein the third voltage is a voltage resulting from reducing the second voltage.

5. The non-volatile semiconductor storage device according to claim 1, wherein the control circuit boosts the first wiring and the second wiring before applying a ground voltage to the first conductive layer.

6. The non-volatile semiconductor storage device according to claim 1, wherein the control circuit sets the first conductive layer in a floating state when boosting voltages of the second wiring and the first wiring.

7. The non-volatile semiconductor storage device according to claim 1, comprising:

a second selection transistor having one end connected to the other end the memory string;

a third wiring having one end connected to the other end of the second selection transistor; and a fourth wiring connected to a gate of the second selection transistor, wherein the second selection transistor comprises:

a third semiconductor layer extending in the vertical direction to the substrate;

a second gate insulation layer formed to surround the third semiconductor layer; and a third conductive layer surrounding the second gate insulation layer and extending parallel to the substrate, the first semiconductor layer comprises a joining portion joining lower ends of a pair of the columnar portions, the second semiconductor layer is formed in contact with a top surface of one of the columnar portions joined by the joining portion, and the third semiconductor layer is formed in contact with a top surface of the other of the columnar portions joined by the joining portion.

8. The non-volatile semiconductor storage device according to claim 7, wherein in the erase operation, the control circuit boosts voltages of the third wiring and the fourth wiring, while keeping the voltage of the third wiring greater than the voltage of the fourth wiring by the certain potential difference.

9. The non-volatile semiconductor storage device according to claim 8, wherein the control circuit selectively connects the third wiring to the first wiring and sets the third wiring to have the same potential as the first wiring.

10. A non-volatile semiconductor storage 5 device comprising:

a memory string including a plurality of memory cells connected in series;

a first selection transistor having one end connected to one end of a respective one of the memory string;

a second selection transistor having one end connected to the other end the memory string;

a first wiring having one end connected to the other end of the first selection transistor;

a second wiring connected to a gate of the first selection transistor; and a third wiring having one end connected to the other end of the second selection transistor;

a fourth wiring connected to a gate of the second selection transistor, and a control circuit configured to perform erase operation to erase data from the memory cells, the memory string comprising:

a first semiconductor layer having a columnar portion extending in a vertical direction to a substrate;

an electric charge storage layer formed to surround the first semiconductor layer; and a first conductive layer surrounding the electric charge storage layer and extending parallel to the substrate, the first selection transistor comprising:

a second semiconductor layer in contact with a top or bottom surface of the columnar portion and extending in the vertical direction to the substrate;

a first gate insulation layer formed 5 to surround the second semiconductor layer; and a second conductive layer surrounding the first gate insulation layer and extending parallel to the substrate, the second selection transistor comprising;

a third semiconductor layer extending in the vertical direction to the substrate;

a second gate insulation layer formed to surround the third semiconductor layer; and a third conductive layer surrounding the second gate insulation layer and extending parallel to the substrate, the control circuit being configured to boost voltages of the second wiring and the first wiring in the erase operation, while keeping the voltage of the first wiring greater than the voltage of the second wiring by a certain potential difference, the certain potential difference being a potential difference that erases data from the memory cells, in the erase operation, the control circuit boosting voltages of the third wiring and the fourth wiring, while keeping the voltage of the third wiring greater than the voltage of the fourth wiring by the certain potential difference, in the erase operation, the control circuit raising the third wiring to a first voltage and the fourth wiring to a second voltage so that the certain potential difference is maintained therebetween, and then starting boosting the third wiring from the first voltage while setting the fourth wiring in a floating state.

11. The non-volatile semiconductor storage device according to claim 8, wherein the control circuit comprises:

a first voltage generation circuit configured to supply a first voltage to be boosted to the first wiring;

a second voltage generation circuit configured to supply a second voltage to the second wiring, the second voltage resulting from delaying the first voltage by a certain period of time and reducing the first voltage by the certain potential difference; and a third voltage generation circuit configured to compare a third voltage with a reference voltage to output a differential signal, the third voltage having a certain relation to the first voltage, the first voltage generation circuit switches between an operational state and a stop state based on the differential signal, and the second voltage generation circuit switches between an operational state and a stop state based on the differential signal.

12. The non-volatile semiconductor storage device according to claim 8, wherein the control circuit boosts the first, second, third, and fourth wirings before applying a ground voltage to the first conductive layer.

13. The non-volatile semiconductor storage device according to claim 1, comprising:

a second selection transistor having one end connected to the other end of the memory string;

a third wiring having one end connected to the other end of the second selection transistor; and a fourth wiring connected to a gate of the second selection transistor, wherein the second selection transistor comprises:

a third semiconductor layer extending in the vertical direction to the substrate;

a second gate insulation layer formed to surround the third semiconductor layer; and a third conductive layer surrounding the second gate insulation layer and extending parallel to the substrate, the second semiconductor layer is formed in contact with a bottom surface of the columnar portion, and the third semiconductor layer is formed in contact with a top surface of the columnar portion.

14. The non-volatile semiconductor storage device according to claim 13, wherein in the erase operation, the control circuit is configured to boost voltages of the third wiring and the fourth wiring, while keeping the voltage of the third wiring greater than the voltage of the fourth wiring by the certain potential difference.

15. The non-volatile semiconductor storage device according to claim 14, wherein the control circuit selectively connects the third wiring to the first wiring and sets the third wiring to have the same potential as the first wiring.

16. A non-volatile semiconductor storage device comprising:

a memory string including a plurality of memory cells connected in series;

a first selection transistor having one end connected to one end of a respective one of the memory string;

a second selection transistor having one end connected to the other end of the memory string;

a first wiring having one end connected to the other end of the first selection transistor;

a second wiring connected to a gate of the first selection transistor;

a third wiring having one end connected to the other end of the second selection transistor; and a fourth wiring connected to a gate of the second selection transistor, and a control circuit configured to perform erase operation to erase data from the memory cells, the memory string comprising:

a first semiconductor layer having a columnar portion extending in a vertical direction to a substrate;

an electric charge storage layer formed to surround the first semiconductor layer; and a first conductive layer surrounding the electric charge storage layer and extending parallel to the substrate, the first selection transistor comprising:

a second semiconductor layer in contact with a top or bottom surface of the columnar portion and extending in the vertical direction to the substrate;

a first gate insulation layer formed to surround the second semiconductor layer; and a second conductive layer surrounding the first gate insulation layer and extending parallel to the substrate, the second selection transistor comprising:

a third semiconductor layer extending in the vertical direction to the substrate;

a second gate insulation layer formed to surround the third semiconductor layer; and a third conductive layer surrounding the second gate insulation layer and extending parallel to the substrate, the second semiconductor layer being formed in contact with a bottom surface of the columnar portion, the third semiconductor layer being formed in contact with a top surface of the columnar portion, the control circuit being configured to boost voltages of the second wiring and the first wiring in the erase operation, while keeping the voltage of the first wiring greater than the voltage of the second wiring by a certain potential difference, the certain potential difference being a potential difference that erases data from the memory cells, in the erase operation, the control circuit being configured to boost voltages of the third wiring and the fourth wiring, while keeping the voltage of the third wiring greater than the voltage of the fourth wiring by the certain potential difference, in the erase operation, the control circuit raising the third wiring to a first voltage and the fourth wiring to a second voltage so that the certain potential difference is maintained therebetween, and then starting boosting the third wiring from the first voltage while setting the fourth wiring in a floating state.

17. The non-volatile semiconductor storage device according to claim 14, wherein
the control circuit boosts the first, second, third, and fourth wirings before applying a ground voltage to the first conductive layer.

18. The non-volatile semiconductor storage device according to claim 1, wherein
the certain potential difference is a potential difference that causes a gate induced drain leakage (GIDL) current.

* * * * *